United States Patent
Kasai et al.

(10) Patent No.: US 8,446,008 B2
(45) Date of Patent: May 21, 2013

(54) SEMICONDUCTOR DEVICE BONDING WITH STRESS RELIEF CONNECTION PADS

(75) Inventors: Masaki Kasai, Kyoto (JP); Hiroshi Okumura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 408 days.

(21) Appl. No.: 12/311,027

(22) PCT Filed: Dec. 20, 2007

(86) PCT No.: PCT/JP2007/074564
§ 371 (c)(1),
(2), (4) Date: Mar. 17, 2009

(87) PCT Pub. No.: WO2008/078655
PCT Pub. Date: Jul. 3, 2008

(65) Prior Publication Data
US 2010/0044863 A1  Feb. 25, 2010

(30) Foreign Application Priority Data

Dec. 25, 2006  (JP) .................. 2006-348571
Dec. 25, 2006  (JP) .................. 2006-348574

(51) Int. Cl.
*H01L 23/48*  (2006.01)
(52) U.S. Cl.
USPC ....................................................... 257/738
(58) Field of Classification Search
USPC ....................................................... 257/738
See application file for complete search history.

(56) References Cited

U.S. PATENT DOCUMENTS

| 5,943,597 | A  |   | 8/1999  | Kleffner et al. |         |
|-----------|----|---|---------|-----------------|---------|
| 5,960,308 | A  |   | 9/1999  | Akagawa et al.  |         |
| 6,077,726 | A  | * | 6/2000  | Mistry et al.   | 438/108 |
| 7,417,326 | B2 | * | 8/2008  | Ikumo et al.    | 257/781 |
| 2003/0052414 | A1 |   | 3/2003  | Cowens et al. |         |
| 2004/0099716 | A1 | * | 5/2004  | Yuan et al.   | 228/246 |
| 2006/0073638 | A1 | * | 4/2006  | Hsu           | 438/110 |
| 2006/0175686 | A1 |   | 8/2006  | Murata et al. |         |

FOREIGN PATENT DOCUMENTS

| CN | 1392607 A | | 1/2003 |
| JP | 07-335648 | | 12/1995 |
| JP | 08-340002 | | 12/1996 |
| JP | 2000-164617 | | 6/2000 |
| JP | 2002-280487 | | 9/2002 |
| JP | 2003-273484 | | 9/2003 |
| JP | 2005-072253 | | 3/2005 |
| JP | 2006086209 A | * | 3/2006 |

\* cited by examiner

*Primary Examiner* — Shaun Campbell
(74) *Attorney, Agent, or Firm* — Rabin & Berdo, P.C.

(57) ABSTRACT

An inventive semiconductor device includes: a semiconductor chip; an internal pad provided on a surface of the semiconductor chip for electrical connection; a surface protective film covering the surface of the semiconductor chip and having a pad opening from which the internal pad is exposed; a stress relief layer provided on the surface protective film and having an opening portion through which the internal pad exposed from the pad opening is exposed; a connection pad including an anchor buried in the pad opening and the opening portion and connected to the internal pad, and a projection provided integrally with the anchor as projecting on the stress relief layer, the projection having a width greater than an opening width of the opening portion; and a metal ball provided for external electrical connection as covering the projection of the connection pad.

4 Claims, 21 Drawing Sheets

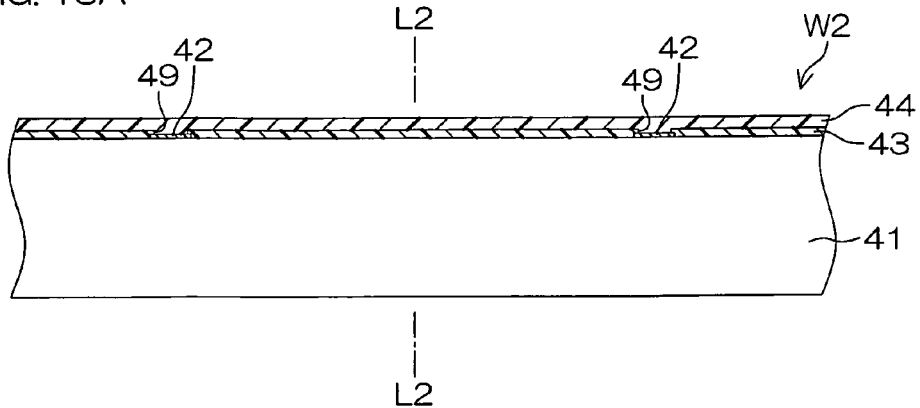
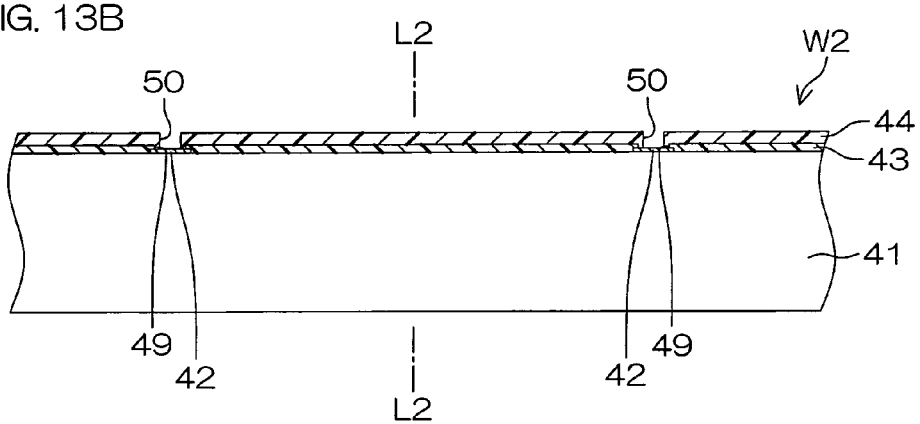
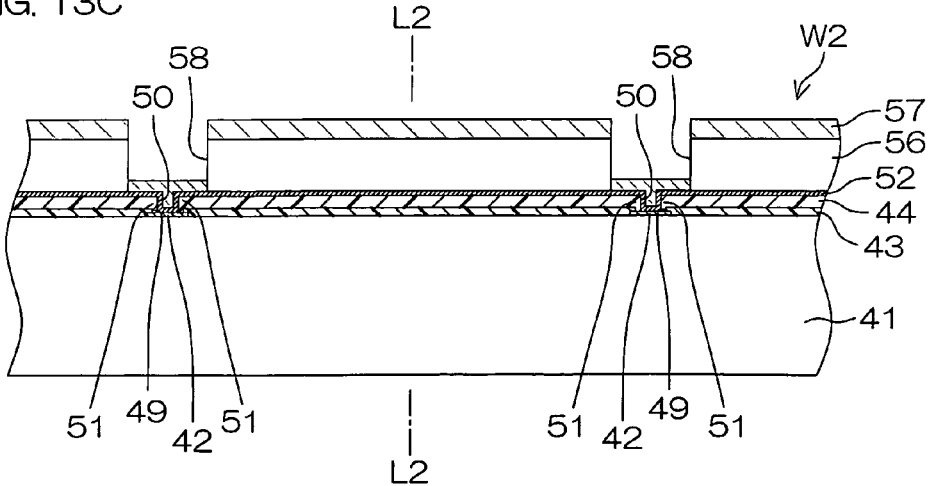

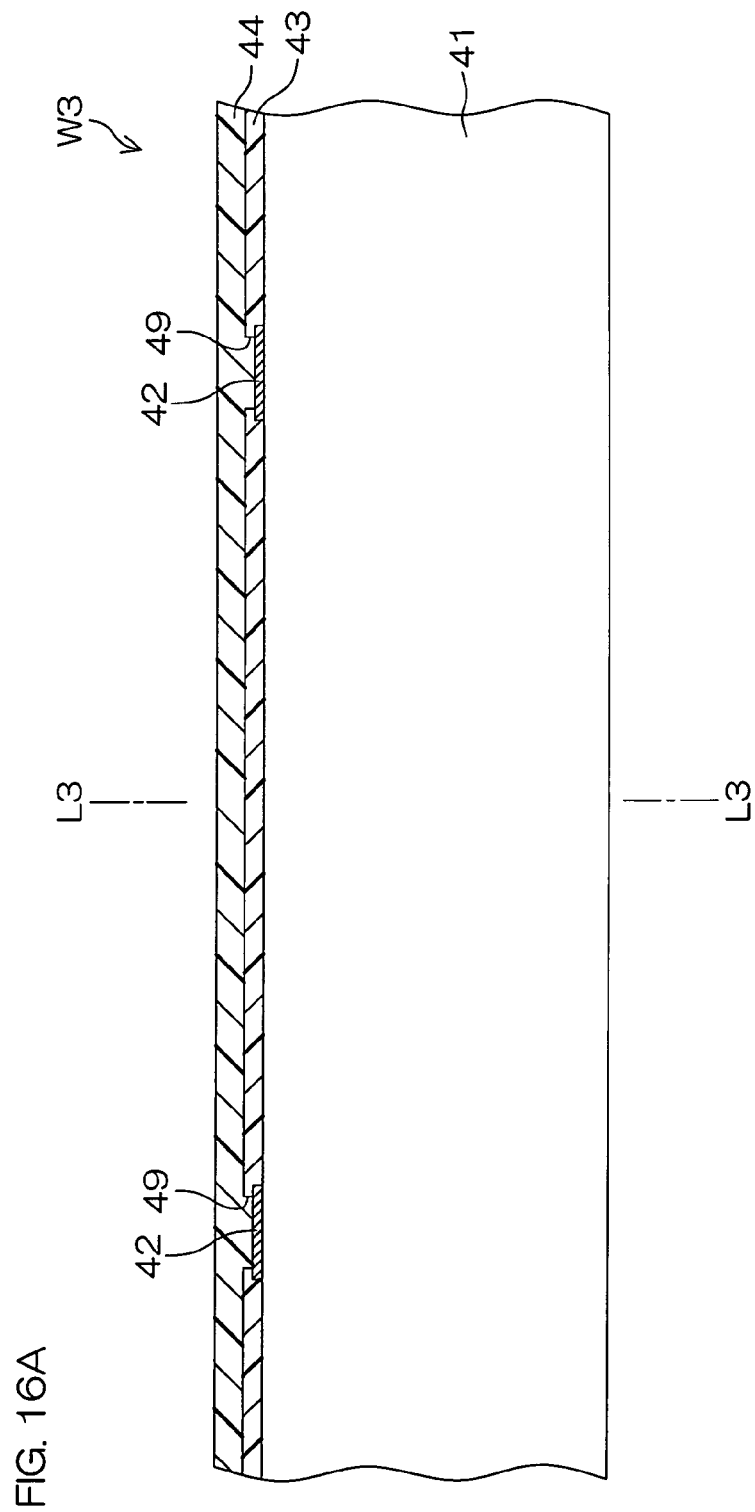

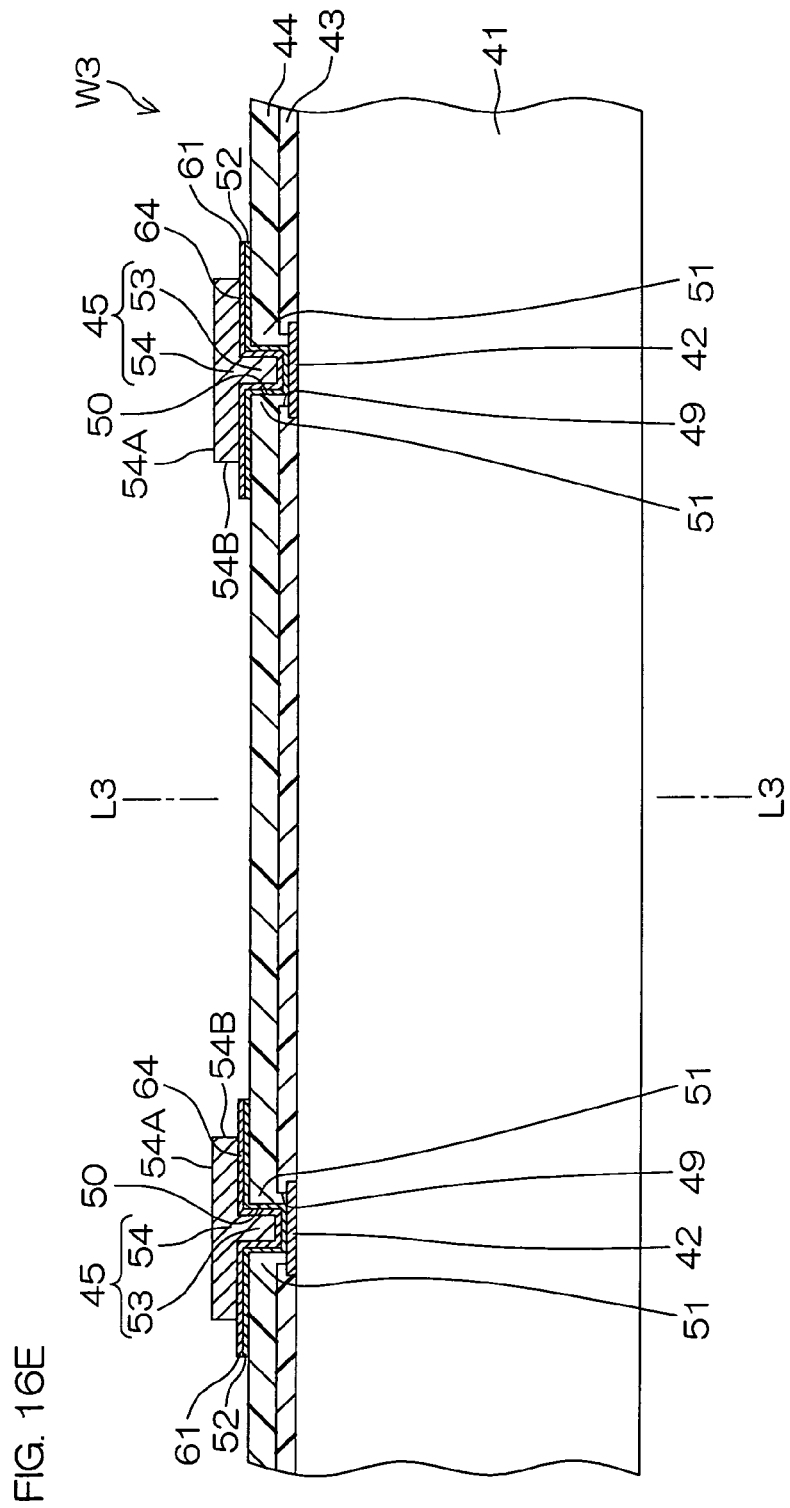

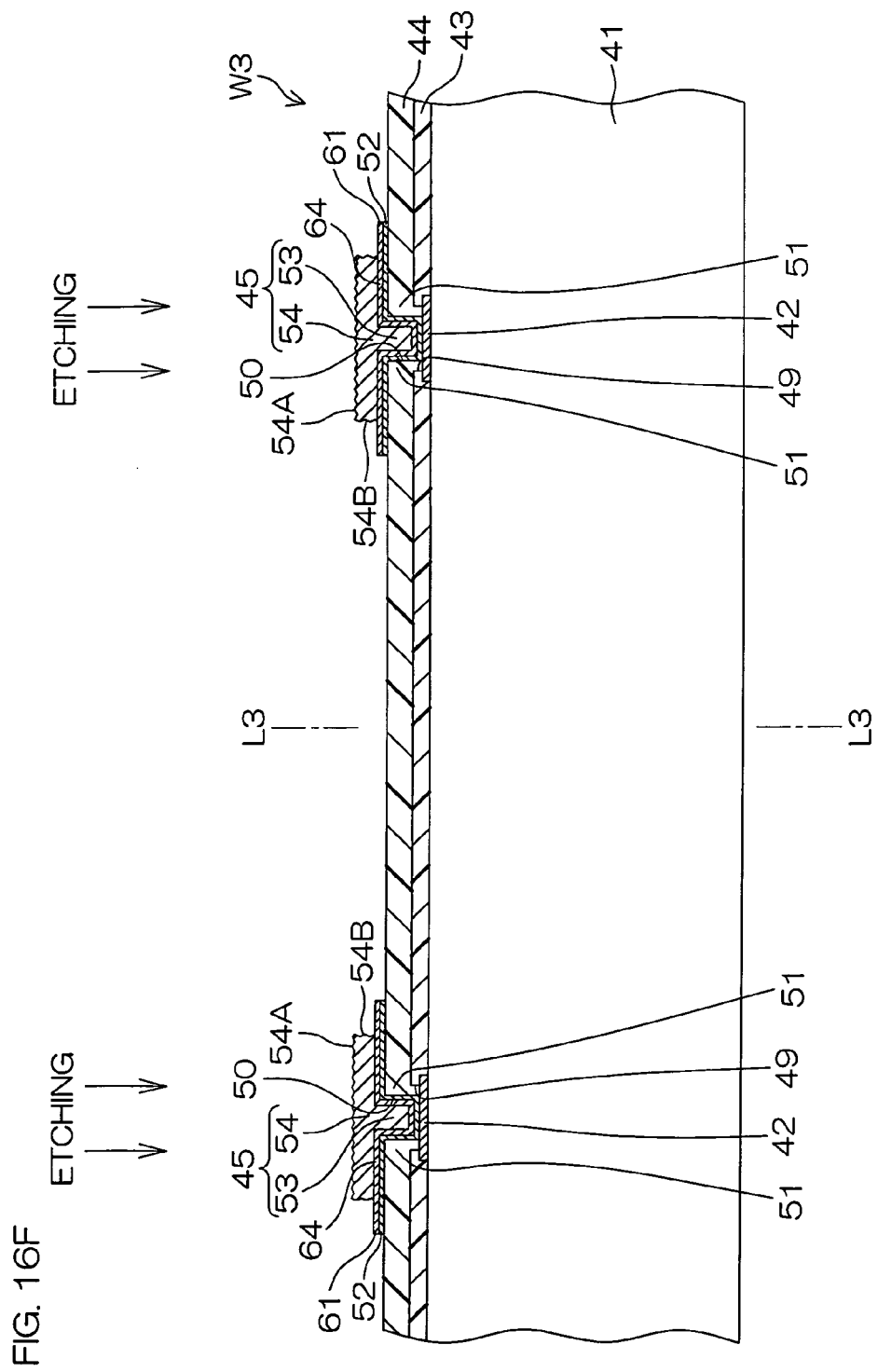

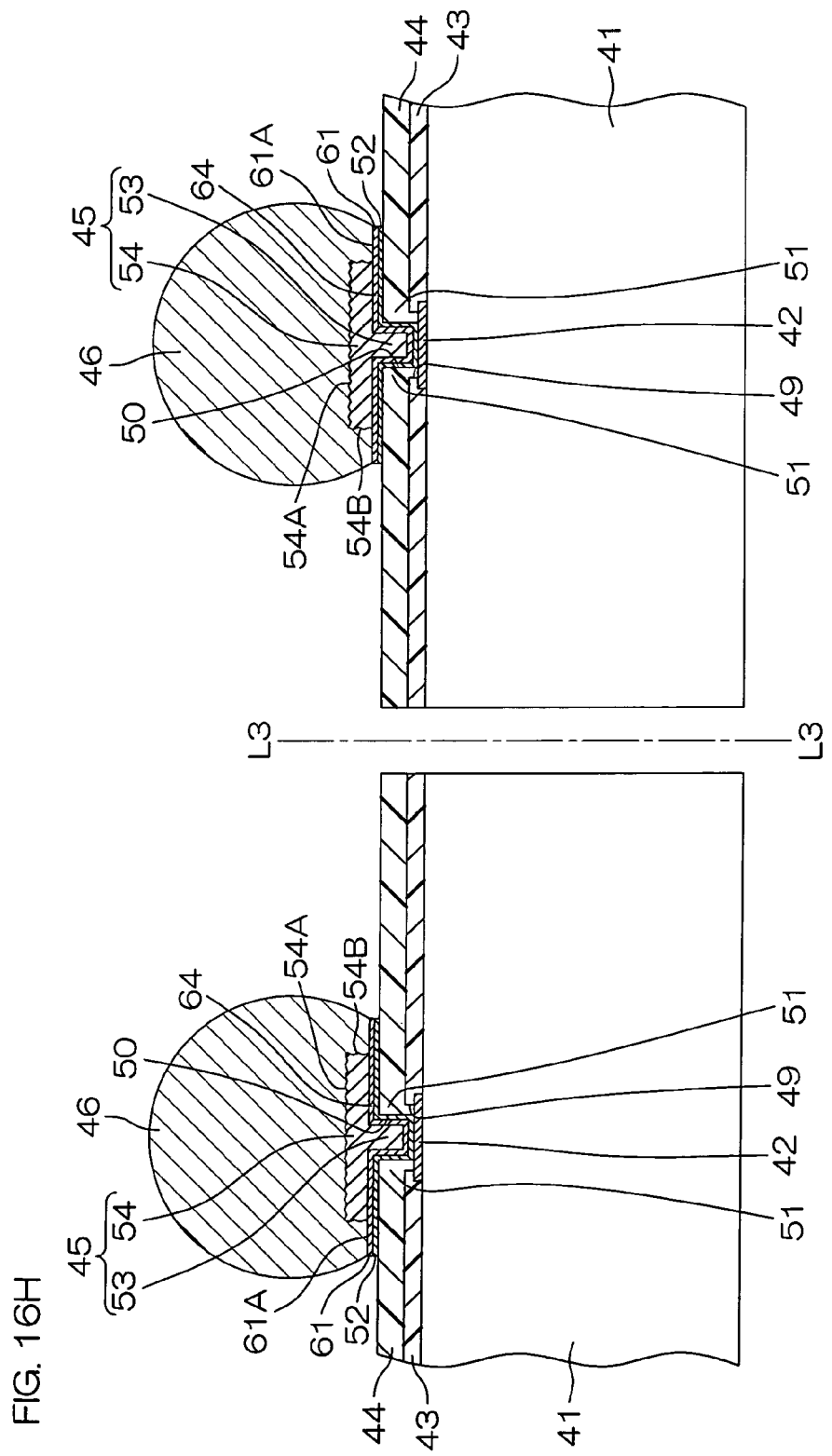

SEMICONDUCTOR DEVICE BONDING WITH STRESS RELIEF CONNECTION PADS

TECHNICAL FIELD

The present invention relates to a semiconductor device and, more specifically, to a semiconductor device based on a WL-CSP (Wafer Level-Chip Size Package) technology.

BACKGROUND ART

Recently, the WL-CSP (Wafer Level-Chip Size Package, hereinafter referred to simply as "WL-CSP") technology has been increasingly employed in practical applications for higher performance and multifunctional semiconductor devices. With the WL-CSP technology, a packaging step is completed at the wafer level, and a chip size obtained by dicing is equal to a package size.

As shown in FIG. 19, a semiconductor device based on the WL-CSP technology includes a semiconductor chip 82 having a surface covered with a surface protective film 81, a stress relief layer 83 provided on the surface protective film 81 and a metal ball (e.g., solder ball) 84 provided on the stress relief layer 83. The surface protective film 81 has a pad opening 86 from which a part of an internal interconnection of the semiconductor chip 82 serving as an electrode pad 85 is exposed. The stress relief layer 83 has a through-hole 87 through which the electrode pad 85 exposed from the pad opening 86 is exposed.

A bump underlying layer 88 of a metal such as titanium covers a surface of the electrode pad 85, an interior surface of the through-hole 87 and a surface portion of the stress relief layer 83 around the through-hole 87. The metal ball 84 is provided on the bump underlying layer 88, and electrically connected to the electrode pad 85 via the bump underlying layer 88. The semiconductor device is mounted on a mount board 89 (or is electrically and mechanically connected to the mount board) by connecting the metal ball 84 to a pad 90 on the mount board 89.

Patent Document 1: JP-A-8(1996)-340002

DISCLOSURE OF THE INVENTION

Problems to be Solved by the Invention

With the semiconductor device mounted on the mount board 89, the metal ball 84 is held between the bump underlying layer 88 on the semiconductor chip 82 and a pad 90 on the mount board 89, and bonded to the bump underlying layer 88 and the pad 90. Therefore, if the semiconductor chip 82 and the mount board 89 are thermally expanded or contracted, a stress occurs in the metal ball 84. The stress is liable to cause a crack in a bonding interface between the metal ball 84 and the bump underlying layer 88.

Further, the metal ball 84 contacts the surface of the bump underlying layer 88 with a small contact area with respect to the bump underlying layer 88. This makes it impossible to provide a sufficient bonding strength between the metal ball 84 and the bump underlying layer 88 (semiconductor chip 82). Therefore, if the stress occurs in the metal ball 84 due to the thermal expansion/thermal contraction of the semiconductor chip 82 and the mount board 89, the metal ball 84 is liable to be separated from the bump underlying layer 88 by the stress.

It is therefore an object of the present invention to provide a semiconductor device which is arranged to prevent the cracking of a metal ball by relieving a stress occurring in the metal ball.

It is another object of the present invention to provide a semiconductor device which is arranged to prevent separation of a solder terminal by improving the bonding strength between the solder terminal and a semiconductor chip.

Means for Solving the Problems

A semiconductor device according to one aspect of the present invention includes: a semiconductor chip; an internal pad provided on a surface of the semiconductor chip for electrical connection; a surface protective film covering the surface of the semiconductor chip and having a pad opening from which the internal pad is exposed; a stress relief layer provided on the surface protective film and having an opening portion through which the internal pad exposed from the pad opening is exposed; a connection pad including an anchor buried in the pad opening and the opening portion and connected to the internal pad, and a projection provided integrally with the anchor as projecting on the stress relief layer, the projection having a width greater than an opening width of the opening portion; and a metal ball provided for external electrical connection as covering the projection of the connection pad.

With this arrangement, the connection pad provided in the opening portion of the stress relief layer integrally includes the anchor buried in the pad opening and the opening portion, and the projection projecting on the stress relief layer. The metal ball is provided for the external electrical connection as covering the projection of the connection pad.

The semiconductor device is mounted on an external mount board by connecting the metal ball to a pad on the mount board. Even if a stress occurs in the metal ball due to thermal expansion/thermal contraction of the semiconductor chip and the mount board with the semiconductor device thus mounted on the mount board, the stress is partly relieved by the projection protruding into the metal ball. This prevents cracking of the metal ball. As a result, the semiconductor device has higher connection reliability.

If the width of the projection of the connection pad was smaller than the opening width of the opening portion of the stress relief layer, i.e., if the width of the projection was smaller than the width of the anchor, a stress would occur in a connection portion between the anchor and the internal pad due to deformation of the projection when the projection relieves the stress. This would result in cracking of the semiconductor chip.

With the aforementioned arrangement, on the contrary, the width of the projection of the connection pad is greater than the opening width of the opening portion of the stress relief layer. That is, the projection extends onto a portion of the stress relief layer around the opening portion. Thus, a stress received by the projection is released to the stress relief layer when the projection relieves the stress. Therefore, even if a great stress occurs in the metal ball, the stress is properly relieved by the connection pad and the stress relief layer. As a result, the cracking of the semiconductor chip is prevented.

In the semiconductor device, the projection of the connection pad is preferably cylindrical.

With this arrangement, the projection of the connection pad has no edge on its side surface because the projection is cylindrical. Therefore, the stress occurring in the metal ball is distributed over the side surface of the (cylindrical) projection, and absorbed by the projection.

The connection pad preferably further includes a second projection provided integrally with the first projection and having a smaller width than the first projection.

With this arrangement, the connection pad further includes the second projection provided integrally with the first projection. Thus, a portion of the connection pad projecting on the stress relief layer has a two-step structure including the first projection and the second projection. With the two-step structure, the portion of the connection pad projecting on the stress relief layer has a height increased by the height of the second projection. Therefore, even if the crack extends beyond the height of the first projection in the metal ball, for example, the extension of the crack is prevented by the second projection. As a result, breakage of the metal ball is suppressed, which may otherwise occur when the crack extends across the entire metal ball.

Further, the second projection is smaller in width than the first projection. Therefore, even if a metal ball having the same volume as the metal ball bonded to the connection pad having no second projection is bonded to the connection pad having the second projection, the height of the metal ball as measured from the surface of the stress relief layer to the top of the metal ball is not significantly increased. As a result, it is possible to provide the aforementioned effect while suppressing an increase in the distance between the semiconductor device and the mount board when the semiconductor device is mounted on the mount board.

A semiconductor device according to another aspect of the present invention includes: a semiconductor chip; an internal pad provided on a surface of the semiconductor chip for electrical connection; a surface protective film covering the surface of the semiconductor chip and having a pad opening from which the internal pad is exposed; a stress relief layer provided on the surface protective film and having an opening portion through which the internal pad exposed from the pad opening is exposed; a connection pad provided on a portion of the internal pad facing to the pad opening and the opening portion, and having a portion projecting on the stress relief layer, the projecting portion having a rough surface, the connection pad being composed of a solder-wettable metal; and a solder terminal provided for external electrical connection as covering the rough surface of the connection pad.

With this arrangement, the connection pad provided in the opening portion of the stress relief layer is composed of the solder-wettable metal, and is configured such as to project on the stress relief layer from the opening portion. The surface of the portion of the connection pad projecting on the stress relief layer is rough with minute undulations and, therefore, has a greater surface area. The solder terminal for the external electrical connection covers the rough surface.

Since the surface of the connection pad in contact with the solder terminal is rough, the contact surface has an improved solder wettability. As a result, the bonding strength between the solder terminal and the connection pad is improved.

Further, the surface of the connection pad in contact with the solder terminal is rough, whereby the contact surface has an increased surface area. This also improves the bonding strength between the solder terminal and the connection pad.

The rough surface has an improved solder wettability. Therefore, even if the amount of a solder used as a material for the solder terminal is reduced, the portion of the connection pad projecting on the stress relief layer can be wetted and covered with the reduced amount of the solder. That is, even the solder terminal made of the reduced amount of the solder can be properly bonded to the connection pad as covering the projecting portion.

The semiconductor device is mounted on an external mount board by connecting the solder terminal to a pad on the mount board. Even if a stress occurs in the solder terminal due to thermal expansion/thermal contraction of the semiconductor chip and the mount board with the semiconductor device thus mounted on the mount board, there is no possibility that the solder terminal is separated from the connection pad, because the solder terminal is bonded to the connection pad with a sufficient bonding strength. As a result, the semiconductor device has higher connection reliability.

With the solder terminal bonded to the connection pad, the portion of the connection pad projecting on the stress relief layer protrudes into the solder terminal. Therefore, even if a stress occurs in the solder terminal, the stress is partly relieved by the portion of the connection pad protruding into the solder terminal. This prevents the cracking of the solder terminal.

The connection pad is preferably configured such that the portion thereof projecting on the stress relief layer extends onto a portion of the stress relief layer around the opening portion.

With this arrangement, the portion of the connection pad projecting on the stress relief layer extends onto the portion of the stress relief layer around the opening portion. Thus, a stress received by the projecting portion can be released to the stress relief layer when the projecting portion relieves the stress. Therefore, even if a great stress occurs in the solder terminal, the stress is properly relieved by the connection pad and the stress relief layer. This prevents the cracking of the semiconductor chip.

The semiconductor device preferably further includes a metal flange provided around the portion of the connection pad projecting on the stress relief layer, the metal flange being composed of a solder-wettable metal.

With this arrangement, the metal flange of the solder-wettable metal surrounds the portion of the connection pad projecting on the stress relief layer. Thus, the solder can easily wet and spread onto the portion of the stress relief layer around the projecting portion. As a result, the bonding strength of the solder terminal is improved.

The foregoing and other objects, features and effects of the present invention will become more apparent from the following description of the embodiments with reference to the attached drawings.

BRIEF DESCRIPTION OF THE DRAWINGS

FIG. 13A is a schematic sectional view showing a step of a production method for the semiconductor device of FIG. 10.

FIG. 13B is a diagram showing a step next to the step of FIG. 13A.

FIG. 13C is a diagram showing a step next to the step of FIG. 13B.

FIG. 16A is a schematic sectional view showing a step of a production method for the semiconductor device of FIG. 15.

FIG. 16E is a diagram showing a step next to the step of FIG. 16D.

FIG. 16F is a diagram showing a step next to the step of FIG. 16E.

FIG. 16H is a diagram showing a step next to the step of FIG. 16G.

DESCRIPTION OF REFERENCE CHARACTERS

1 SEMICONDUCTOR CHIP, 2 ELECTRODE PAD, 3 SURFACE PROTECTIVE FILM, 4 STRESS RELIEF LAYER, 5 CONNECTION PAD, 6 METAL BALL, 9 PAD OPENING, 10 THROUGH-HOLE, 13 ANCHOR, 14 PROJECTION, 24 METAL PAD, 25 ANCHOR, 26 PROJECTION, 27 UPPER PROJECTION PORTION, 28 LOWER PROJECTION PORTION, 41 SEMICONDUCTOR CHIP, 42 ELECTRODE PAD, 43 SURFACE PROTECTIVE FILM, 44 STRESS RELIEF LAYER, 45 CONNECTION PAD, 46 SOLDER BALL, 49 PAD OPENING, 50 THROUGH-HOLE, 54 PROJECTION, 54A DISTAL SURFACE, 54B SIDE SURFACE, 60 SURFACE, 61 PERIPHERAL PORTION, 64 OUTER PERIPHERAL COPPER FILM, 66 PROJECTION, 67 UPPER PROJECTION PORTION, 67A LOWER SURFACE, 67B SIDE SURFACE, 68 LOWER PROJECTION PORTION, 68A DISTAL SURFACE, 68B SIDE SURFACE, 69 METAL PAD

BEST MODE FOR CARRYING OUT THE INVENTION

Figure 1:
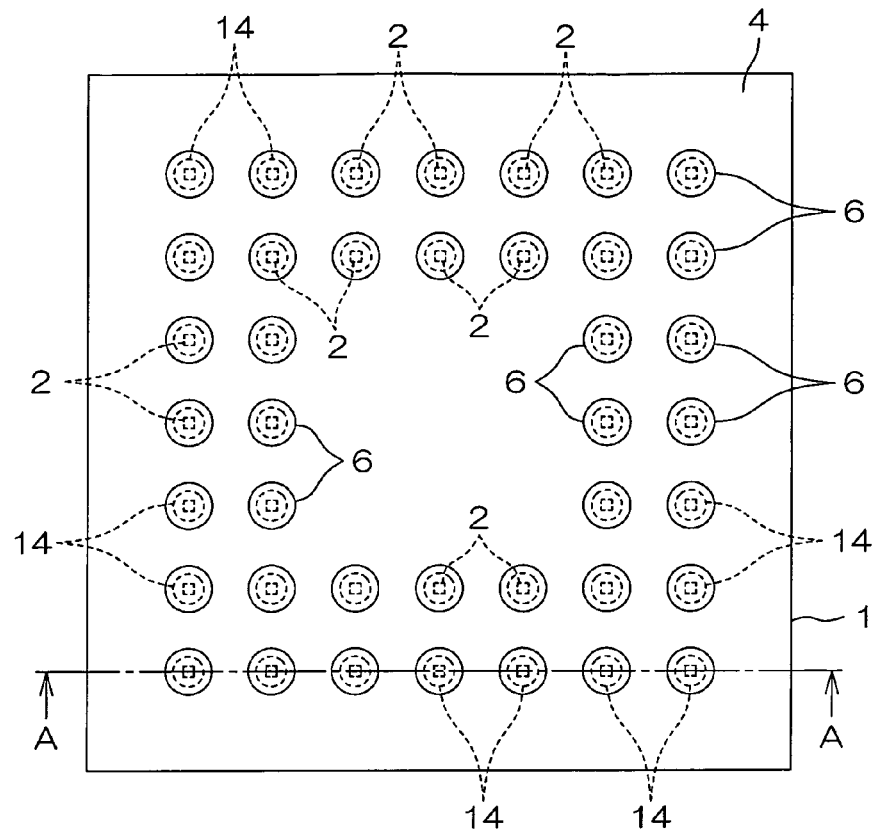
FIG. 1 is a schematic bottom view of a semiconductor device according to a first embodiment of the present invention.
Figure 2:
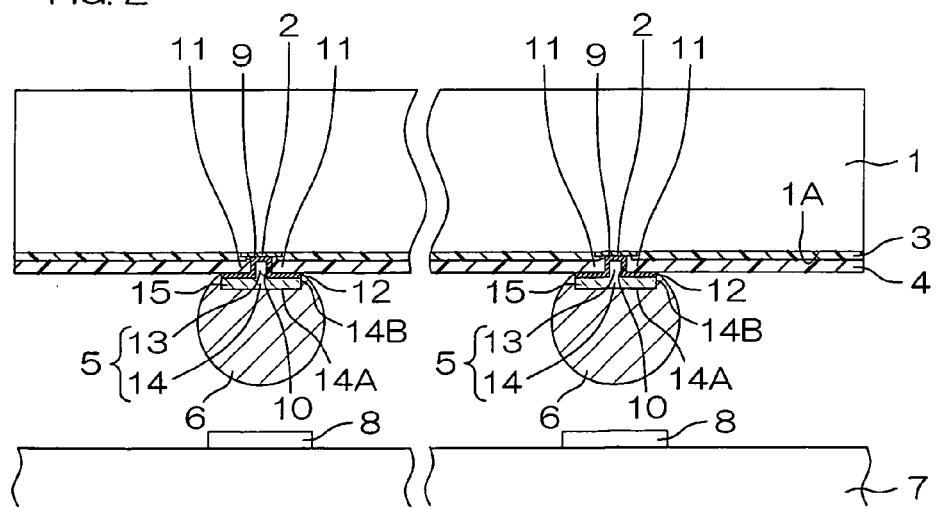
FIG. 2 is a sectional view taken along a sectional plane A-A in FIG. 1.

FIG. 1 is a schematic bottom view of a semiconductor device according to a first embodiment of the present invention (illustrating a surface thereof to be bonded to a mount board). FIG. 2 is a sectional view taken along a sectional plane A-A in FIG. 1. In FIG. 2, a part of the semiconductor device is not shown with the semiconductor device being partly broken along break lines.

The semiconductor device is a semiconductor device produced based on the WL-CSP technology, and includes a semiconductor chip 1, a surface protective film 3 covering a functional surface 1A of the semiconductor chip 1 (a surface of the semiconductor chip formed with a functional element), a stress relief layer 4 provided on the surface protective film 3, connection pads 5 projecting on the stress relief layer 4, and metal balls 6 connected to the respective connection pads 5 for external electrical connection. The semiconductor device is mounted on a mount board 7 (or is electrically and mechanically connected to the mount board 7) by respectively connecting the metal balls 6 to pads 8 on the mount board 7.

The semiconductor chip 1 is, for example, a silicon chip having a generally rectangular shape as seen in plan, and has a plurality of electrode pads 2 (internal pads) provided on the functional surface 1A thereof.

The electrode pads 2 are, for example, aluminum pads each having a generally rectangular shape as seen in plan, and are electrically connected to the functional element formed in the functional surface 1A of the semiconductor chip 1. The electrode pads 2 are arranged in two rows in properly spaced relation in a generally rectangular frame-like area as seen in plan along an outer periphery of the semiconductor chip 1 (see FIG. 1).

The surface protective film 3 is made of silicon oxide or silicon nitride. The surface protective film 3 has pad openings 9 from which the electrode pads 2 are exposed.

The stress relief layer 4 is, for example, made of polyimide. The stress relief layer 4 covers the entire surface of the surface protective film 3, and has the function of absorbing and relieving a stress applied to the semiconductor device. The stress relief layer 4 has through-holes 10 (opening portions) provided at positions opposed to the respective electrode pads 2, so that the electrode pads 2 exposed from the respective pad openings 9 face outward through the corresponding through-holes 10. Further, bump underlying layers 12 such as of titanium, chromium or titanium tungsten are each provided as covering a surface of the electrode pad 2, an interior surface of the through-hole 10, a surface portion 11 of the stress relief layer 4 around the through-hole 10.

The connection pads 5 are, for example, made of copper. The connection pads 5 each include an anchor 13 buried in the pad opening 9 and the through-hole 10, and a projection 14 provided integrally with the anchor 13 as projecting on the stress relief layer 4.

The anchor 13 is, for example, cylindrical, and is electrically connected to the electrode pad 2 via the bump underlying layer 12.

The projection 14 is, for example, cylindrical, and has a height of 10 to 50 μm. The projection 14 has a width (diameter) greater (or wider) than the opening width (diameter) of the through-hole 10 as measured perpendicularly to a direction (hereinafter referred to as "stacking direction") in which the stress relief layer 4 is stacked on the semiconductor chip 1. Thus, a peripheral portion 15 of the projection 14 extends perpendicularly to the stacking direction, and is opposed to the surface of the stress relief layer 4 via the bump underlying layer 12 in the stacking direction.

The metal balls 6 are, for example, each made of a solder material in a spherical shape, and each cover the entire surface (including a distal surface 14A and a side surface 14B) of the projection 14 of the connection pad 5. Thus, the metal balls 6 are each opposed to the electrode pad 2 via the bump underlying layer 12 and the connection pad 5 and, as a whole, are arranged in two rows in the rectangular frame-like area along the outer periphery of the semiconductor chip 1 (see FIG. 1).

FIGS. 3A to 3E are schematic sectional views showing a production method for the semiconductor device of FIG. 1.

Figure 3A:
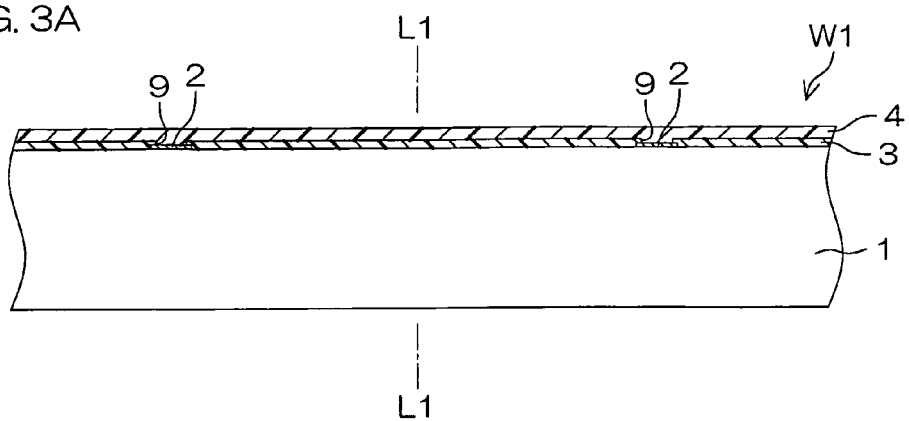
FIG. 3A is a schematic sectional view showing a step of a production method for the semiconductor device of FIG. 1.

For production of the semiconductor device, as shown in FIG. 3A, a wafer W1 formed with a plurality of semiconductor chips 1 and having a surface entirely covered with a surface protective film 3 is first prepared. The surface protective film 3 is formed with pad openings 9 from which electrode pads 2 are exposed.

Figure 3B:
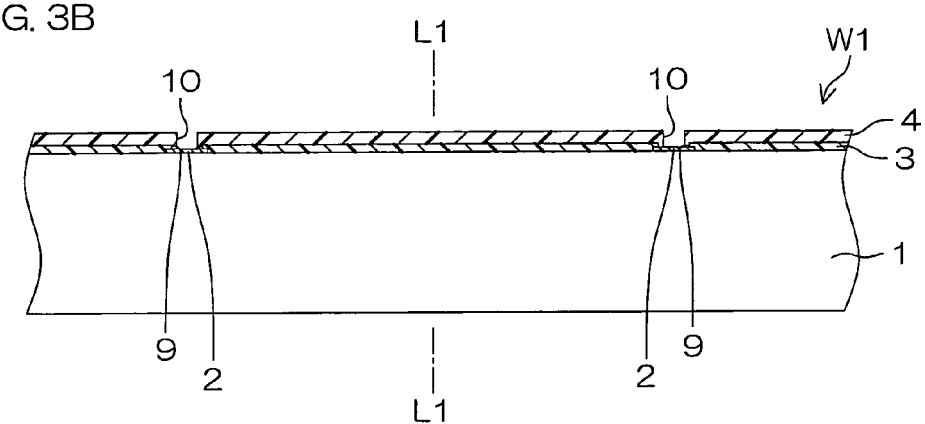
FIG. 3B is a diagram showing a step next to the step of FIG. 3A.

A stress relief layer 4 is formed on the surface protective film 3 on the wafer W1. In turn, as shown in FIG. 3B, through-holes 10 are formed in the stress relief layer 4.

Figure 3C:
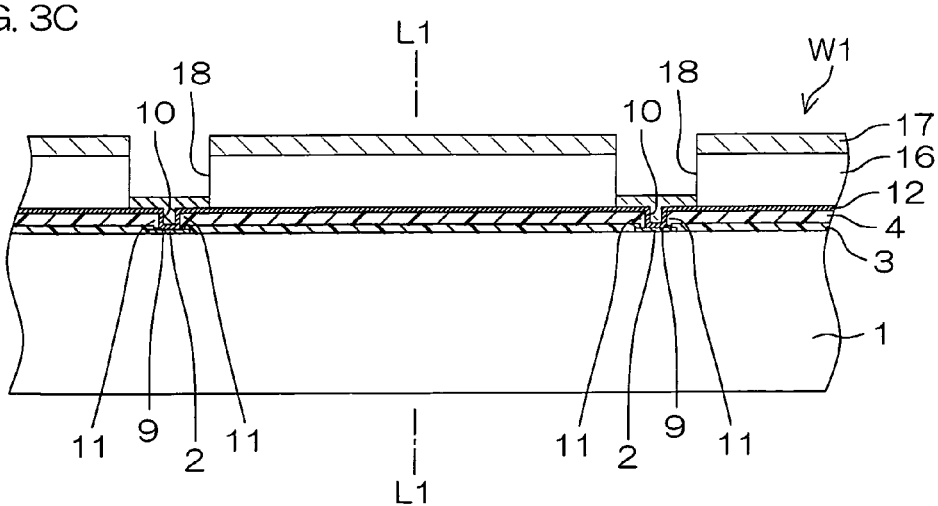
FIG. 3C is a diagram showing a step next to the step of FIG. 3B.

After the formation of the through-holes 10, as shown in FIG. 3C, a bump underlying layer 12, a photoresist 16 and a metal layer 17 are formed in this order on the resulting wafer W1. More specifically, the bump underlying layer 12 is formed in the entire region on the wafer W1 by a sputtering method or the like. Then, the photoresist 16 is formed on the bump underlying layer 12 by a known photolithography technique as having openings 18 in regions in which projections 14 of connection pads 5 are to be formed. After the formation of the photoresist 16, the metal layer 17 is formed from copper as a material for the connection pads 5 in the entire region on the resulting wafer W1 by a sputtering method or the like.

Thereafter, the photoresist 16 is removed, whereby an unnecessary portion (a portion except for the connection pads 5) of the metal layer 17 is lifted off together with the photoresist 16. Thus, the connection pads 5 are formed. Then, an unnecessary portion (a portion not formed with the connection pads 5) of the bump underlying layer 12 is removed by etching.

Figure 3D:
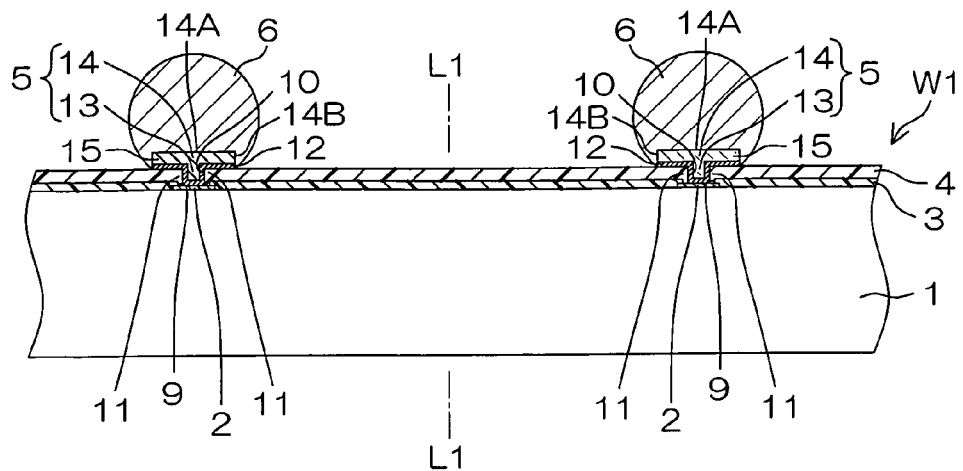
FIG. 3D is a diagram showing a step next to the step of FIG. 3C.
Figure 3E:
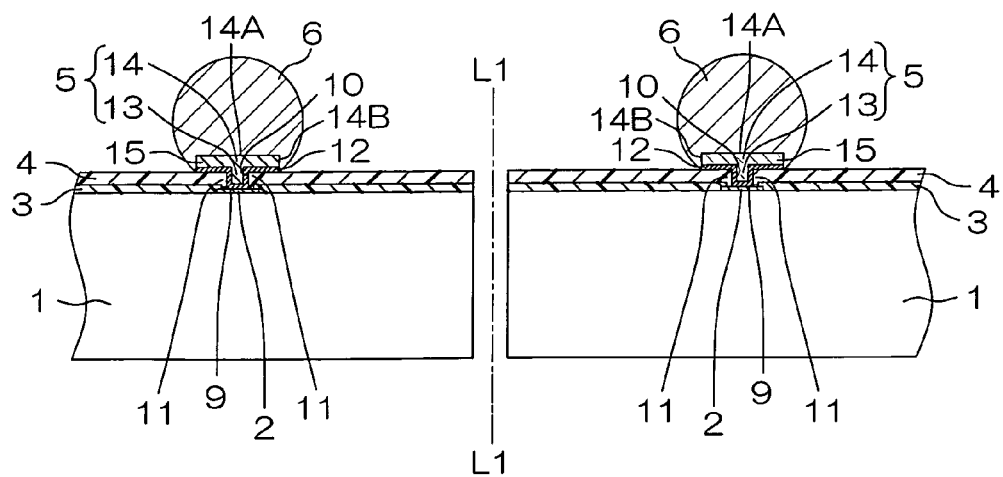
FIG. 3E is a diagram showing a step next to the step of FIG. 3D.

Subsequently, as shown in FIG. 3D, metal balls 6 are formed as respectively covering the entire surfaces (each including a distal surface 14A and a side surface 14B) of the projections 14 of the connection pads 5. Then, as shown in FIG. 3E, the resulting wafer W1 is cut (diced) along dicing lines L1 defined between the semiconductor chips 1 in the wafer W1. Thus, semiconductor devices are provided, which each have the construction shown in FIG. 1.

In the semiconductor device, as described above, the connection pads 5 provided in the respective through-holes 10 of the stress relief layer 4 each integrally include an anchor 13 buried in the pad opening 9 and the through-hole 10, and a projection 14 projecting on the stress relief layer 4. The metal balls 6 for the external electrical connection are respectively bonded to the connection pads 5 as covering the projections 14 of the connection pads 5.

Therefore, even if a stress occurs in any of the metal balls 6 due to the thermal expansion/thermal contraction of the semiconductor chip 1 and the mount board 7 with the metal balls respectively connected to the pads 8 on the mount board 7 in the semiconductor device mounted state, the stress is partly relieved by the side surface of the projection 14 protruding into the metal ball 6. This prevents the cracking of the metal balls 6. As a result, the semiconductor device has higher connection reliability.

Figure 4:
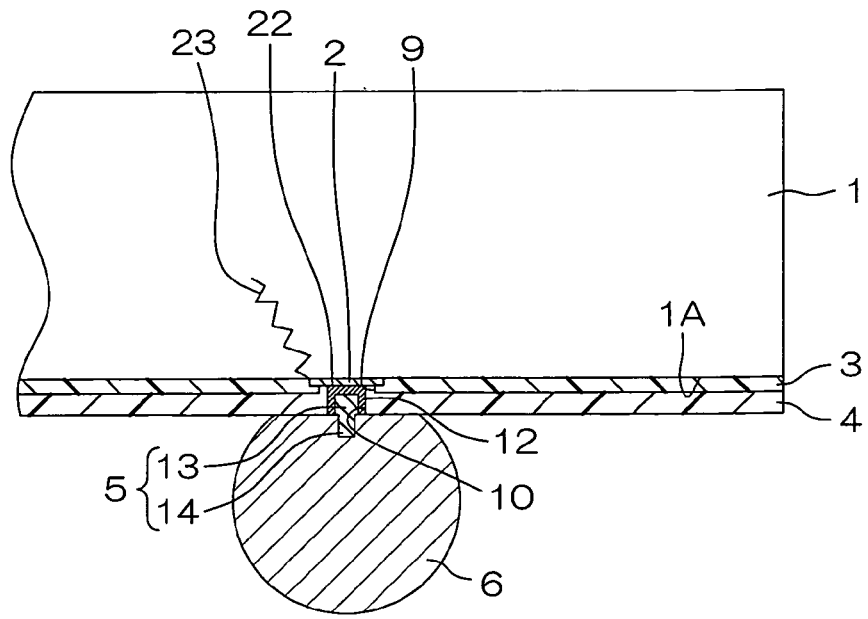
FIG. 4 is a schematic sectional view showing a case in which a projection is formed as having a width (diameter) smaller than the opening width (diameter) of a through-hole unlike in the semiconductor device shown in FIG. 1.

If the width (diameter) of the projection 14 of the connection pad 5 was smaller than the opening width (diameter) of the through-hole 10 of the stress relief layer 4, i.e., if the width (diameter) of the projection 14 was smaller than the width (diameter) of the anchor 13, as shown in FIG. 4, a stress would occur in a connection portion 22 between the anchor 13 and the electrode pad 2 due to deformation of the projection 14 when the projection 14 relieves the stress. The stress would cause a crack 23 in the semiconductor chip 1.

In this embodiment, on the contrary, the width (diameter) of the projection 14 of the connection pad 5 is greater than the opening width (diameter) of the through-hole 10 of the stress relief layer 4. That is, the peripheral portion 15 of the projection 14 extends onto the portion 11 of the stress relief layer 4 around the through-hole 10. Thus, a stress received by the projection 14 is released to the stress relief layer 4 when the projection 14 relieves the stress. Therefore, even if a great stress occurs in any of the metal balls 6, the stress is properly relieved by the connection pad 5 and the stress relief layer 4. As a result, the cracking of the semiconductor chip 1 is prevented.

Further, the projection 14 of the connection pad 5 is cylindrical and, therefore, has no edge on its side surface. Therefore, the stress occurring in any of the metal balls 6 is distributed over the side surface of the (cylindrical) projection 14, and absorbed by the projection 14.

Figure 5:
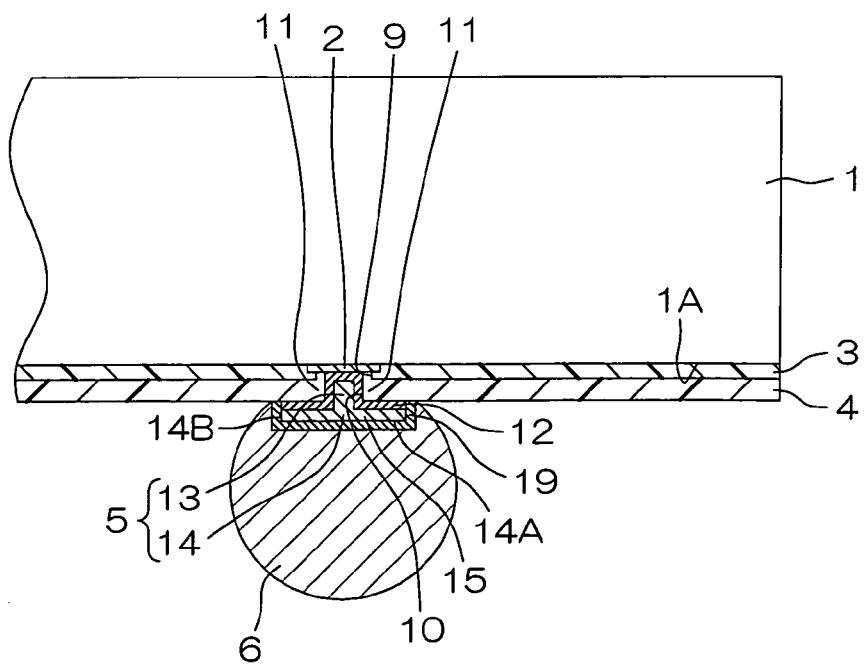
FIG. 5 is a schematic sectional view showing a modification of the semiconductor device of FIG. 1 in which a connection pad is modified.

In this embodiment, copper is used for the formation of the connection pads 5, but the connection pads 5 may be formed of gold. In this case, a diffusion prevention layer 19 of nickel for prevention of diffusion of gold, for example, is preferably provided in an interface between the projection 14 of the connection pad 5 and the metal ball 6 as shown in FIG. 5.

Figure 6:
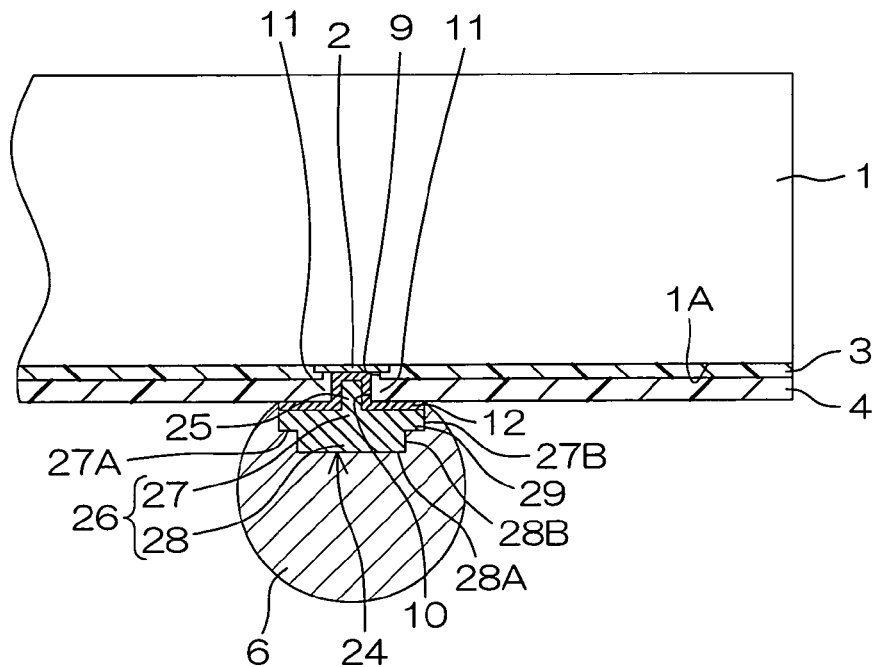
FIG. 6 is a schematic sectional view showing a portion around a metal pad in a semiconductor device according to a second embodiment of the present invention.

FIG. 6 is a schematic sectional view showing a portion around a metal pad in a semiconductor device according to a second embodiment of the present invention. In FIG. 6, components corresponding to those shown in FIG. 1 or 2 will be denoted by the same reference characters as in FIG. 1 or 2.

In the arrangement shown in FIG. 6, a metal pad 24 of copper is provided instead of the connection pad 5 on the bump underlying layer 12. The metal pad 24 includes an anchor 25 buried in the pad opening 9 and the through-hole 10, and a projection 26 provided integrally with the anchor 25 as projecting on the stress relief layer 4.

The anchor 25 is, for example, cylindrical, and is electrically connected to the electrode pad 2 via the bump underlying layer 12.

The projection 26 includes an upper projection portion 27 provided on the side of the stress relief layer 4 (which is hereinafter defined as an upper side) with respect to the stacking direction, and an lower projection portion 28 (second projection) provided below the upper projection portion 27 integrally with the upper projection portion 27.

The upper projection portion 27 is, for example, cylindrical, and has a height of 10 to 50 μm. The upper projection portion 27 has a width (diameter) greater than the opening width (diameter) of the trough-hole 10 as measured perpendicularly to the stacking direction. Thus, a peripheral portion 29 of the upper projection portion 27 extends perpendicularly to the stacking direction, and is opposed to the surface of the stress relief layer 4 via the bump underlying layer 12 in the stacking direction.

Like the upper projection portion 27, the lower projection portion 28 is, for example, cylindrical, and has a height of 10 to 50 μm. Further, the lower projection portion 28 has a width (diameter) smaller than the width (diameter) of the upper projection portion 27 as measured perpendicularly to the stacking direction.

In the arrangement shown in FIG. 6, the metal ball 6 is bonded to the metal pad 24 as covering the entire surfaces of the upper projection portion 27 and the lower projection portion 28 (including a lower surface 27A and a side surface 27B of the upper projection portion 27 and a distal surface 28A and a side surface 28B of the lower projection portion 28). Therefore, this arrangement provides the same effects as the arrangement shown in FIGS. 1 and 2.

Figure 7:
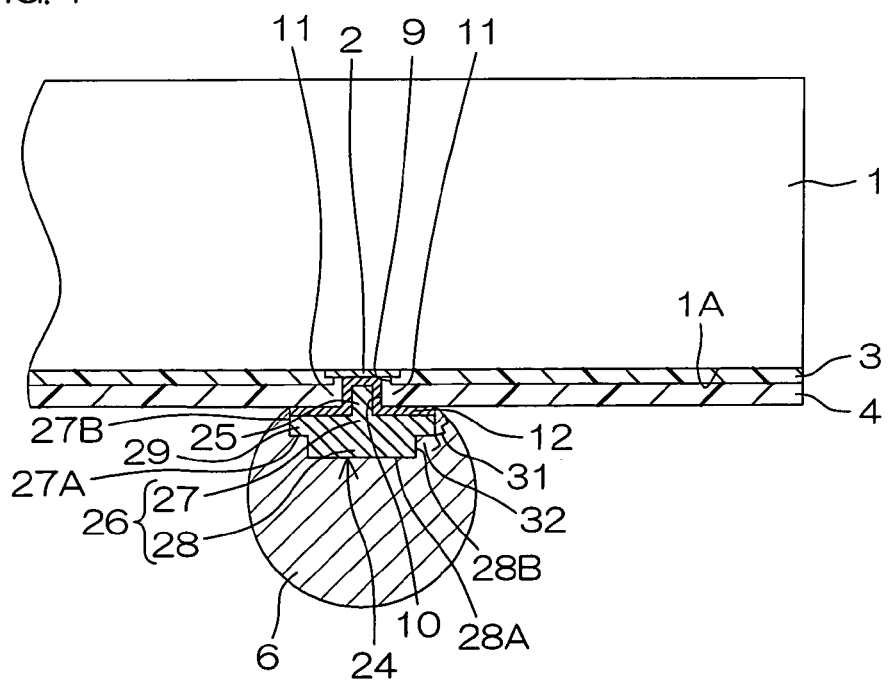
FIG. 7 is a diagram showing a cracked metal ball in the semiconductor device shown in FIG. 6.

Since the metal pad 24 includes the lower projection portion 28 integrally provided on the upper projection portion 27, a portion of the metal pad 24 projecting on the stress relief layer 4 has a two-step structure including the upper projection portion 27 and the lower projection portion 28. With the two-step structure, the portion of the metal pad 24 projecting on the stress relief layer 4 has a height increased by the height of the lower projection portion 28. Therefore, even if a crack 31 extends to a position 32 beyond the height of the upper projection portion 27 in the metal ball 6, as shown in FIG. 7, the extension of the crack 31 is prevented by the lower projection portion 28. As a result, breakage of the metal ball 6 is suppressed, which may otherwise occur when the crack 31 extends across the entire metal ball 6.

Further, the width (diameter) of the lower projection portion 28 is smaller than the width (diameter) of the upper projection portion 27 as measured perpendicularly to the stacking direction. Therefore, even if a metal ball having the same volume as the metal ball 6 bonded to the connection pad 5 having no lower projection portion 28 is bonded to the metal pad 24 having the lower projection portion 28 as shown in FIG. 6, the height of the metal ball 6 as measured from the surface of the stress relief layer 4 to the top of the metal ball 6 is not significantly increased. As a result, it is possible to provide the aforementioned effect while suppressing an increase in the distance between the semiconductor device and the mount board when the semiconductor device is mounted on the mount board.

Figure 8:
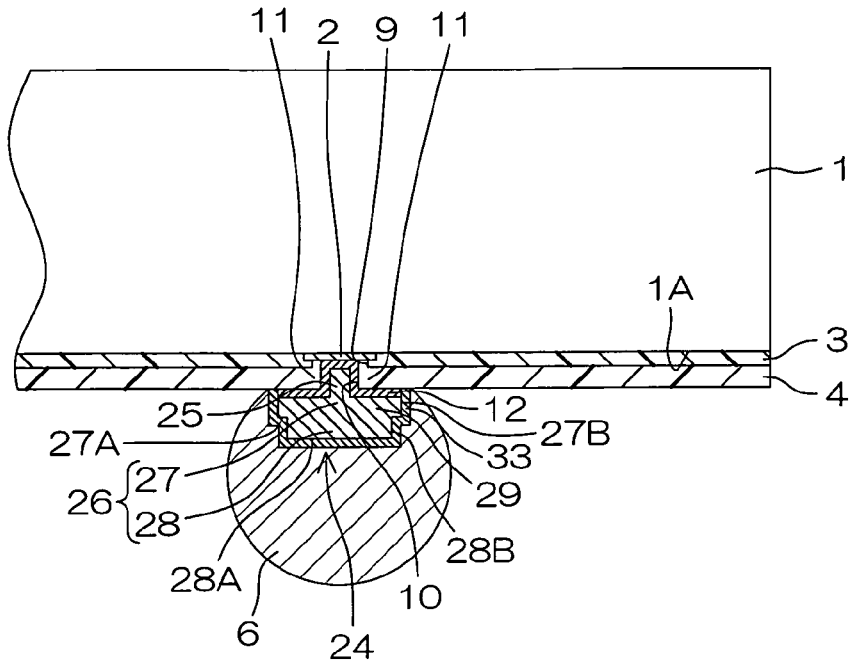
FIG. 8 is a schematic sectional view showing a modification of the semiconductor device of FIG. 6 in which the metal pad is modified.

In this embodiment, the metal pad 24 may be formed of gold as in the first embodiment. In this case, as shown in FIG. 8, a diffusion prevention layer 33 of nickel for prevention of diffusion of gold, for example, is preferably provided in an interface between the metal ball 6 and the upper and lower projection portions 27, 28 of the metal pad 24.

Figure 10:
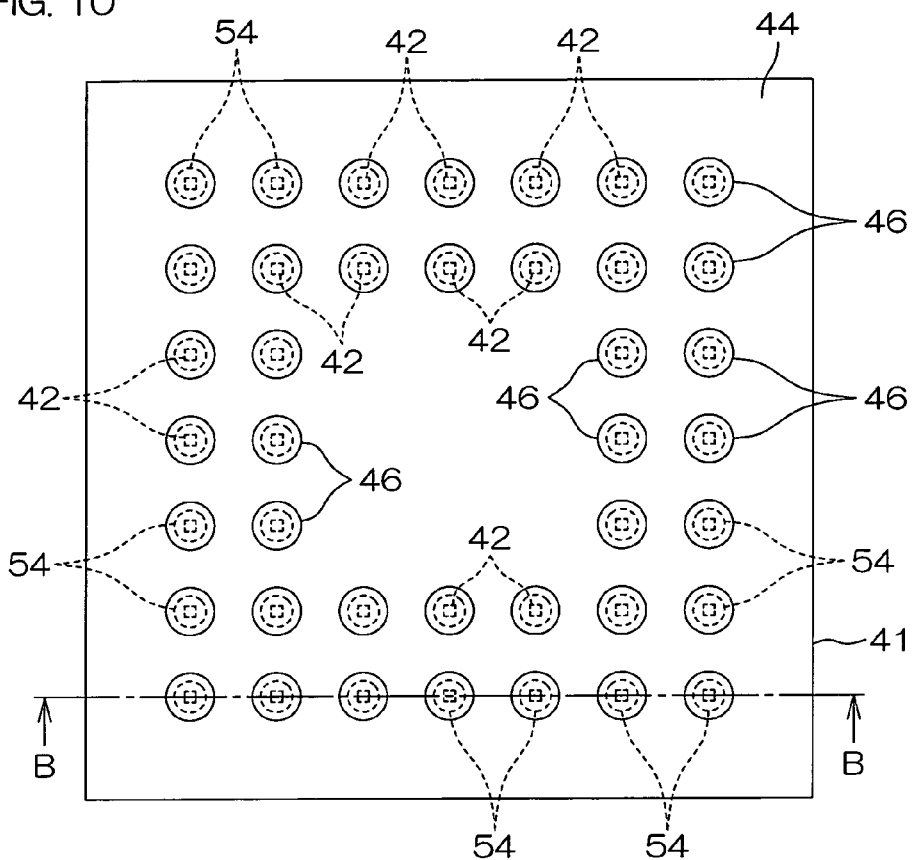
FIG. 10 is a schematic bottom view of a semiconductor device according to a third embodiment of the present invention.
Figure 11:
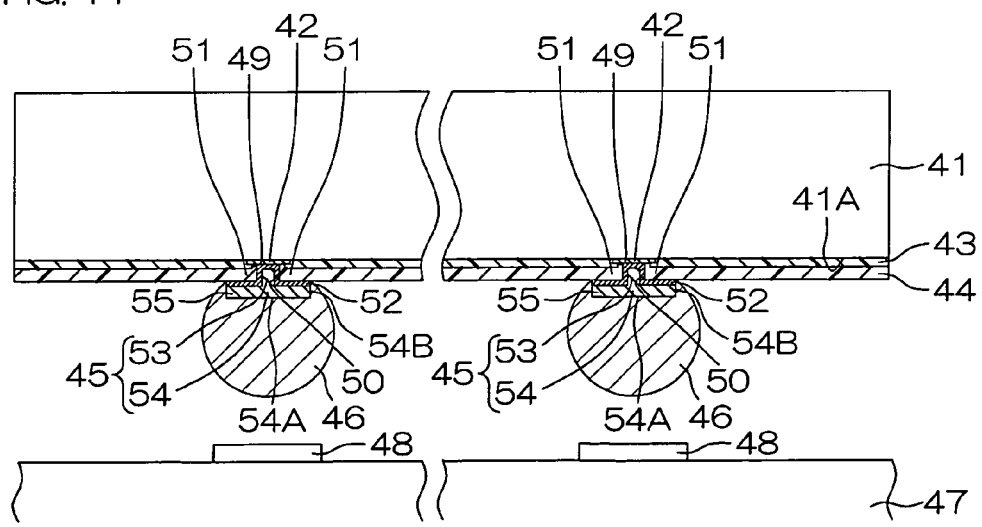
FIG. 11 is a sectional view taken along a sectional plane B-B in FIG. 10.
Figure 12:
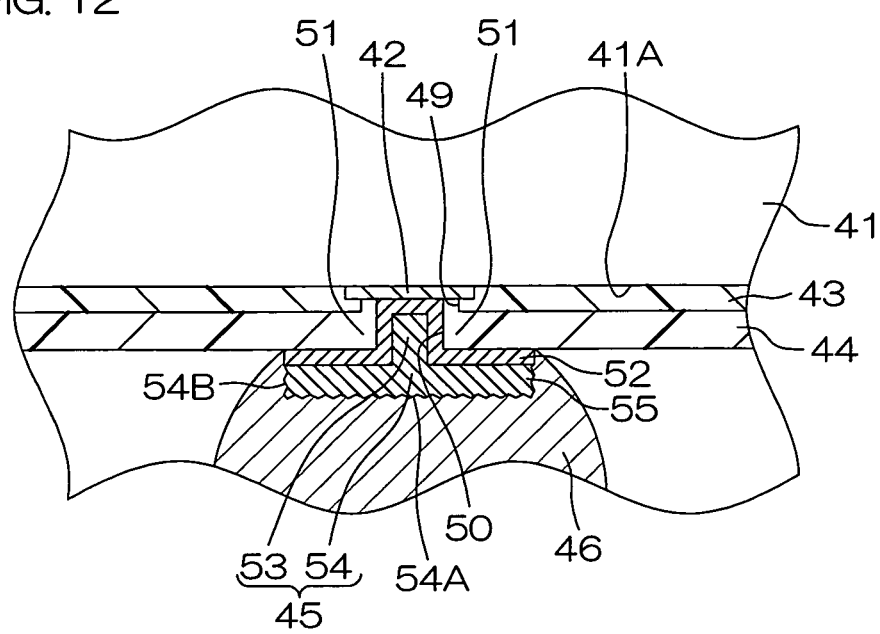
FIG. 12 is a schematic sectional view showing a connection portion between a connection pad and a solder ball in the semiconductor device of FIG. 11 on an enlarged scale.

FIG. 10 is a schematic bottom view of a semiconductor device according to a third embodiment of the present invention (illustrating a surface thereof bonded to a mount board). FIG. 11 is a sectional view taken along a sectional plane B-B in FIG. 10. In FIG. 11, a part of the semiconductor device is not shown with the semiconductor device being partly broken along break lines. FIG. 12 is a schematic sectional view showing a connection portion between a connection pad and a solder ball in the semiconductor device of FIG. 11 on an enlarged scale.

The semiconductor device is a semiconductor device produced based on the WL-CSP technology, and includes a semiconductor chip 41, a surface protective film 43 covering a functional surface 41A of the semiconductor chip 41 (a surface of the semiconductor chip formed with a functional element), a stress relief layer 44 provided on the surface protective film 43, connection pads 45 projecting on the stress relief layer 44, and solder balls 46 (solder terminals) bonded to the respective connection pads 45 for external electrical connection. The semiconductor device is mounted on a mount board 47 (or is electrically and mechanically connected to the mount board 47) by respectively connecting the solder balls 46 to pads 48 on the mount board 47.

The semiconductor chip 41 is, for example, a silicon chip having a generally rectangular shape as seen in plan, and has a plurality of electrode pads 42 (internal pads) provided on the functional surface 41A thereof.

The electrode pads 42 are, for example, aluminum pads each having a generally rectangular shape as seen in plan, and are electrically connected to the functional element formed in the functional surface 41A of the semiconductor chip 41. The electrode pads 42 are arranged in two rows in properly spaced relation in a generally rectangular frame-like area as seen in plan along an outer periphery of the semiconductor chip 41 (see FIG. 10).

The surface protective film 43 is made of silicon oxide or silicon nitride. The surface protective film 43 has pad openings 49 from which the electrode pads 42 are exposed.

The stress relief layer 44 is, for example, made of polyimide. The stress relief layer 44 covers the entire surface of the surface protective film 43, and has the function of absorbing and relieving a stress applied to the semiconductor device. The stress relief layer 44 has through-holes 50 (opening portions) provided at positions opposed to the respective electrode pads 42, so that the electrode pads 42 exposed from the respective pad openings 49 face outward through the corresponding through-holes 50. Further, bump underlying layers 52 such as of titanium, chromium or titanium tungsten are each provided as covering a surface of the electrode pad 42, an interior surface of the through-hole 50, a surface portion 51 of the stress relief layer 44 around the through-hole 50.

The connection pads 45 are made of a solder-wettable metal such as copper. The connection pads 45 each include an anchor 53 buried in the pad opening 49 and the through-hole 50, and a projection 54 provided integrally with the anchor 53 as projecting on the stress relief layer 44.

The anchor 53 is, for example, cylindrical, and is electrically connected to the electrode pad 42 via the bump underlying layer 52.

The projection 54 is, for example, cylindrical and has a height of 10 to 50 μm. The projection 54 has a width (diameter) greater (or wider) than the opening width (diameter) of the through-hole 50 as measured perpendicularly to a direction (hereinafter referred to as "stacking direction") in which the stress relief layer 44 is stacked on the semiconductor chip 41. Thus, a peripheral portion 55 of the projection 54 extends perpendicularly to the stacking direction, and is opposed to the surface of the stress relief layer 44 via the bump underlying layer 52 in the stacking direction. Further, as shown in FIG. 12, the entire surface (including a distal surface 54A and a side surface 54B) of the projection 54 is rough with minute undulations.

Further, the projection has a distal surface that faces away from the stress relief layer, and which has a first portion disposed directly aligned with the anchor and a second portion over the stress relief layer. The first portion and the second portion collectively define the entire distal surface of the projection as being flat and are at a common level. The distal surface and a side surface of the projection are rough.

The solder balls 46 are, for example, each made of a solder material in a spherical shape, and each cover the entire rough surface (including the distal surface 54A and the side surface 54B) of the projection 54 of the connection pad 45. Thus, the solder balls 46 are each opposed to the electrode pad 42 via the bump underlying layer 52 and the connection pad 45 and, as a whole, are arranged in two rows in the rectangular frame-like area along the outer periphery of the semiconductor chip 41 (see FIG. 10).

FIGS. 13A to 13F are schematic sectional views showing a production method for the semiconductor device of FIG. 10.

For production of the semiconductor device, as shown in FIG. 13A, a wafer W2 formed with a plurality of semiconductor chips 41 and having a surface entirely covered with a surface protective film 43 is first prepared. The surface protective film 43 is formed with pad openings 49 from which electrode pads 42 are exposed. A stress relief layer 44 is formed on the surface protective film 43 on the wafer W2.

In turn, as shown in FIG. 13B, through-holes 50 are formed in the stress relief layer 44.

After the formation of the through-holes 50, as shown in FIG. 13C, a bump underlying layer 52, a photoresist 56 and a metal layer 57 are formed in this order on the resulting wafer W2. More specifically, the bump underlying layer 52 is formed in the entire region on the wafer W2 by a sputtering method or the like. Then, the photoresist 56 is formed on the bump underlying layer 52 as having openings 58 in regions to be formed with projections 54 of connection pads 45 by a known photolithography technique. After the formation of the photoresist 56, the metal layer 57 is formed from copper as a material for the connection pads 45 in the entire region on the resulting wafer W2 by a sputtering method or the like.

Thereafter, the photoresist 56 is removed, whereby an unnecessary portion (a portion except for the connection pads 45) of the metal layer 57 is lifted off together with the photoresist 56. Thus, the connection pads 45 are formed. Then, an unnecessary portion (a portion not formed with the connection pads 45) of the bump underlying layer 52 is removed by etching.

Figure 13D:
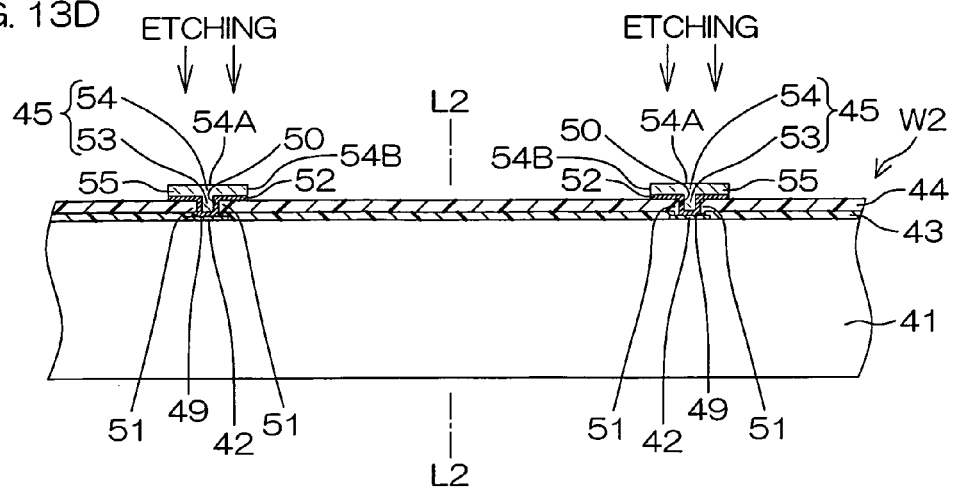
FIG. 13D is a diagram showing a step next to the step of FIG. 13C.

In turn, as shown in FIG. 13D, the entire surfaces (each including a distal surface 54A and a side surface 54B) of the projections 54 of the connection pads 45 projecting on the stress relief layer 44 are formed with minute undulations, for example, by etching (e.g., dry etching) or the like. Thus, the distal surface 54A and the side surface 54B are roughened.

Figure 13E:
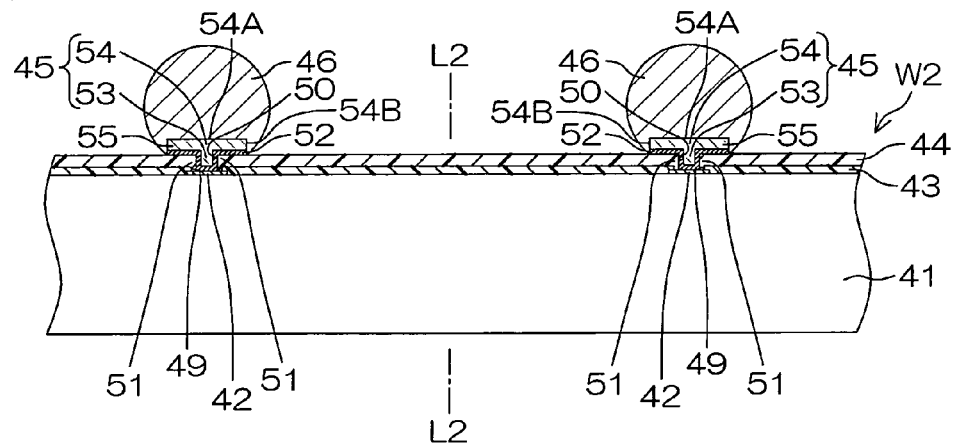
FIG. 13E is a diagram showing a step next to the step of FIG. 13D.
Figure 13F:
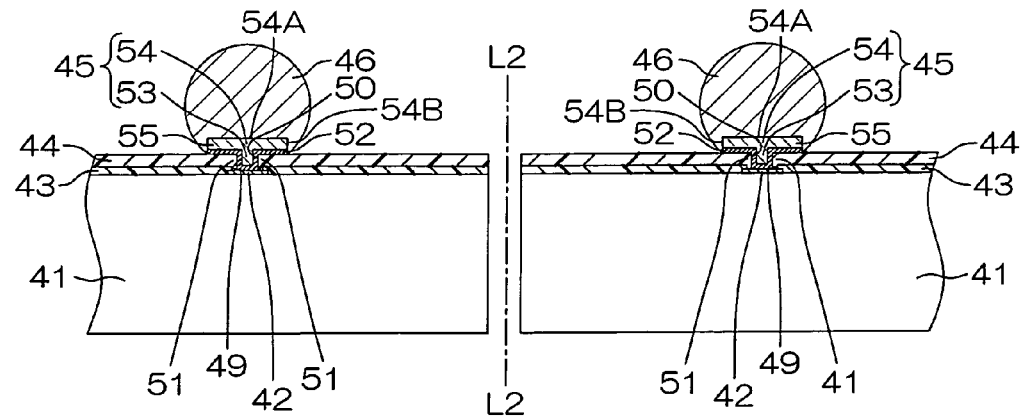
FIG. 13F is a diagram showing a step next to the step of FIG. 13E.

Subsequently, as shown in FIG. 13E, solder balls 46 are respectively bonded to the connection pads 45 as covering the entire rough surfaces (each including the distal surface 54A and the side surface 54B) of the projections 54 of the connection pads 45. Then, as shown in FIG. 13F, the resulting wafer W2 is cut (diced) along dicing lines L2 defined between the semiconductor chips 41 in the wafer W2. Thus, semiconductor devices are provided, which each have the construction shown in FIG. 10.

In the semiconductor device, as described above, the connection pads 45 provided in the respective through-holes 50 of the stress relief layer 44 are made of the solder-wettable metal (e.g., copper), and each include the projection 54 projecting on the stress relief layer 44 from the through-hole 50. The entire surface (including the distal surface 54A and the side surface 54B) of the projection 54 is roughened with the minute undulations and, therefore, has a greater surface area. The solder ball 46 covers the entire rough surface (the distal surface 54A and the side surface 54B) of the projection 54.

Since the entire surface (the distal surface 54A and the side surface 54B) of the projection 54 of the connection pad 45 to be brought into contact with the solder ball 46 is roughened, the solder wettability of the surface is improved. As a result, the bonding strength between the solder ball 46 and the connection pad 45 is improved.

The roughening of the entire surface (the distal surface 54A and the side surface 54B) of the projection 54 increases the surface area of the surface. This also improves the bonding strength between the solder ball 46 and the connection pad 45.

The solder wettability of the entire surface (the distal surface 54A and the side surface 54B) of the projection 54 is improved by the roughening. Therefore, even if the amount of the solder used as the material for the solder ball 46 is reduced, the projection 54 can be wetted and covered with the reduced amount of the solder. That is, even the solder ball made of the reduced amount of the solder can be properly bonded to the connection pad 45 as covering the projection 54.

The semiconductor device is mounted on the external mount board 47 by connecting the solder balls 46 thereof to the pads 48 on the mount board 47. Even if a stress occurs in any of the solder balls 46 due to thermal expansion/thermal contraction of the semiconductor chip 41 and the mount board 47 with the semiconductor device thus mounted on the mount board 47, there is no possibility that the solder ball 46 is separated from the connection pad 45, because the solder balls 46 are bonded to the respective connection pads 45 with a sufficient bonding strength. As a result, the semiconductor device has higher connection reliability.

With the solder ball 46 bonded to the connection pad 45, the projection 54 protrudes into the solder ball 46. Therefore, even if a stress occurs in the solder ball 46, the stress is partly relieved by the side surface 54B of the projection 54 protruding into the solder ball 46. This prevents the cracking of the solder ball 46.

Further, the peripheral portion 55 of the projection 54 extends onto the portion 51 of the stress relief layer 44 around the through-hole 50. Thus, a stress received by the projection 54 is released to the stress relief layer 44 when the projection 54 relieves the stress. Therefore, even if a great stress occurs in the solder ball 46, the stress is properly relieved by the connection pad 45 and the stress relief layer 44. This prevents the cracking of the semiconductor chip 41.

Further, the projection 54 of the connection pad 45 is cylindrical and, therefore, has no edge on its side surface. Therefore, the stress occurring in the solder ball 46 is distributed over the side surface of the (cylindrical) projection 54, and absorbed by the projection 54.

Figure 14:
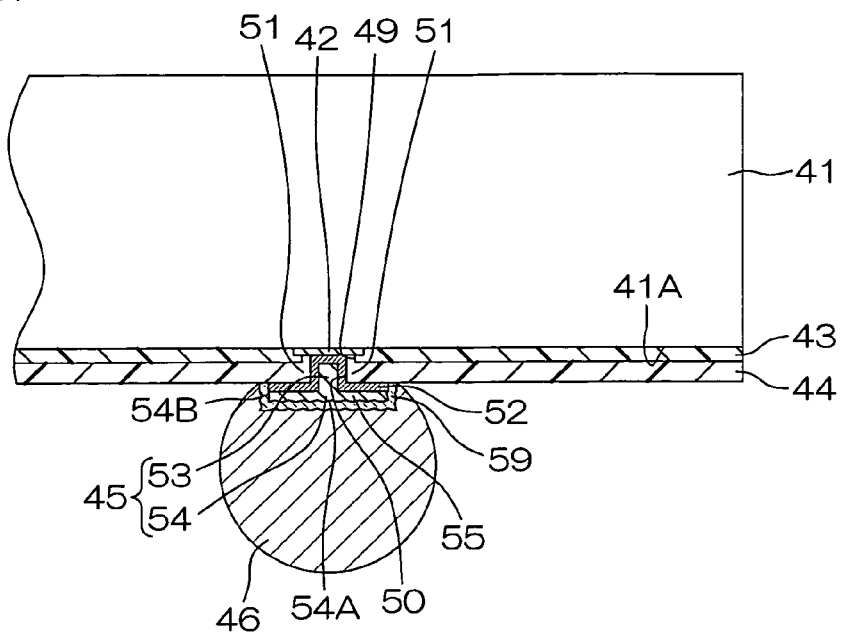
FIG. 14 is a schematic sectional view showing a modification of the semiconductor device of FIG. 10 in which the connection pad is modified.

In this embodiment, copper is used for the formation of the connection pads 45. However, the material for the connection pads 45 is not limited to copper, as long as the material is a solder-wettable metal. For example, gold may be used for the formation of the connection pads 45. In this case, as shown in FIG. 14, a diffusion prevention layer 59 of nickel for prevention of diffusion of gold, for example, is preferably provided in an interface between the projection 54 of the connection pad 45 and the solder ball 46.

Figure 15:
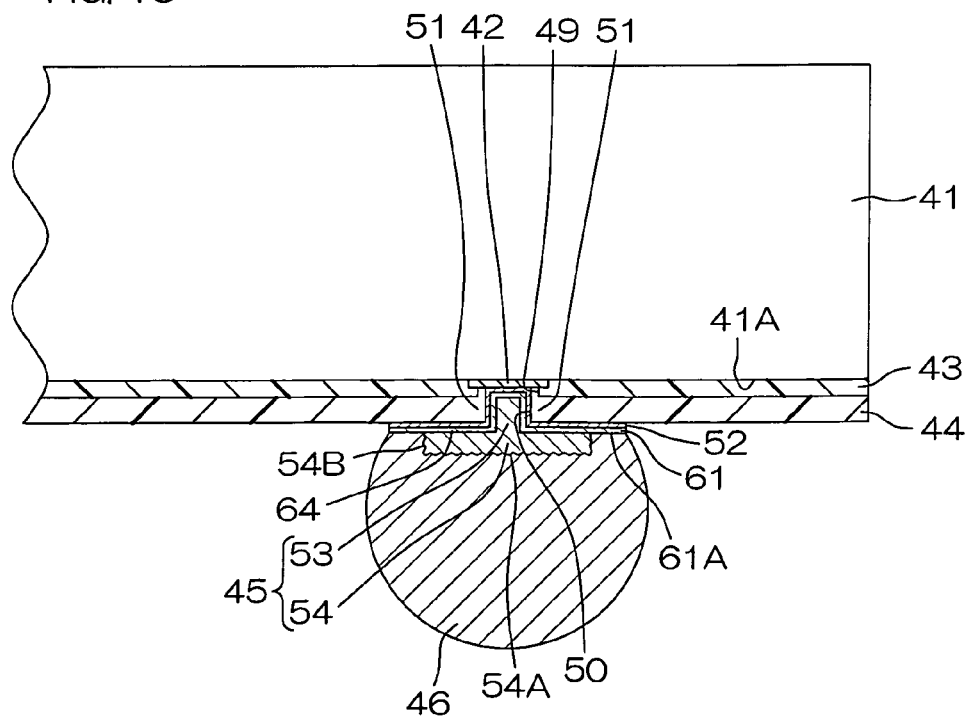
FIG. 15 is a schematic sectional view of a semiconductor device according to a fourth embodiment of the present invention.

FIG. 15 is a schematic sectional view of a semiconductor device according to a fourth embodiment of the present invention. In FIG. 15, components corresponding to those shown in FIG. 10 or 11 will be denoted by the same reference characters as in FIG. 10 or 11.

In the arrangement shown in FIG. 15, an outer peripheral copper film 64 and a connection pad 45 are provided in this order on the bump underlying layer 52.

The outer peripheral copper film 64 is made of a solder-wettable metal (e.g., copper). Further, the outer peripheral copper film 64 has a generally round shape as seen in plan, and has a thickness of 0.1 to 2 μm.

The connection pad 45 includes an anchor 53 and a projection 54 as in the semiconductor device according to the first embodiment.

The anchor 53 is, for example, cylindrical, and is electrically connected to the electrode pad 42 via the bump underlying layer 52 and the outer peripheral copper film 64.

The projection 54 is, for example, cylindrical, and has a height of 10 to 50 μm. The projection 54 has a width (diameter) smaller than the outer peripheral copper film 64 as measured perpendicularly to the stacking direction. Thus, a peripheral portion 61 of the outer peripheral copper film 64 extends laterally of the projection 54, and surrounds the projection 54. The peripheral portion 61 serves as a metal flange having a thickness smaller than the height of the projection 54 projecting on the stress relief layer 44. Further, the entire surface (including a distal surface 54A and a side surface 54B) of the projection 54 is rough with minute undulations.

The solder ball 46 is bonded to the connection pad 45 as covering the entire rough surface (the distal surface 54A and the side surface 54B) of the projection 54 of the connection pad 45 and a surface 61A of the peripheral portion 61 of the outer peripheral copper film 64.

FIGS. 16A to 16H are schematic sectional views showing a production method for the semiconductor device of FIG. 15.

For production of the semiconductor device shown in FIG. 15, a wafer W3 formed with a plurality of semiconductor chips 41 and having a surface entirely covered with a surface protective film 43 is first prepared as shown in FIG. 16A. The surface protective film 43 is formed with pad openings 49 from which electrode pads 42 are exposed. A stress relief layer 44 is formed on the surface protective film 43 on the wafer W3.

Figure 16B:
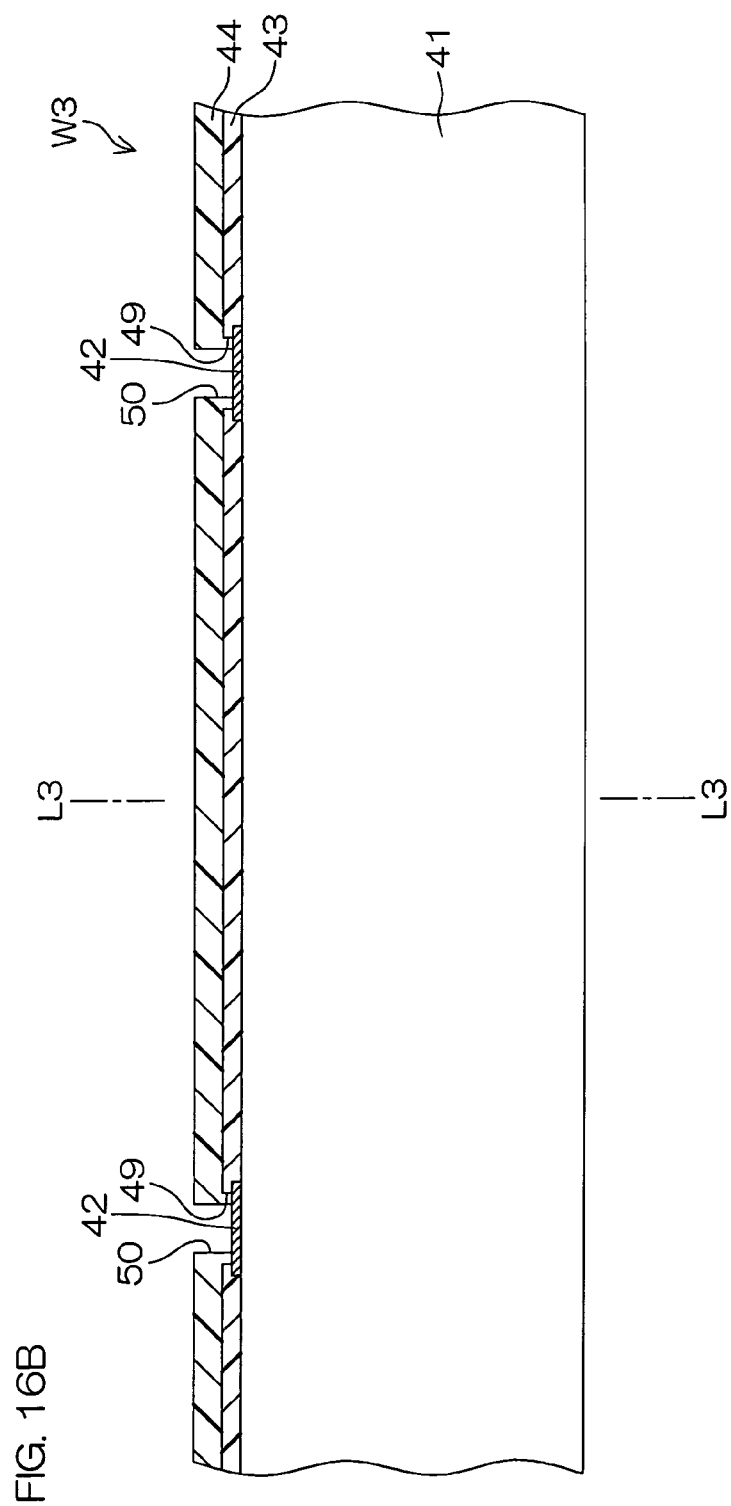
FIG. 16B is a diagram showing a step next to the step of FIG. 16A.

In turn, as shown in FIG. 16B, through-holes 50 are formed in the stress relief layer 44.

Figure 16C:
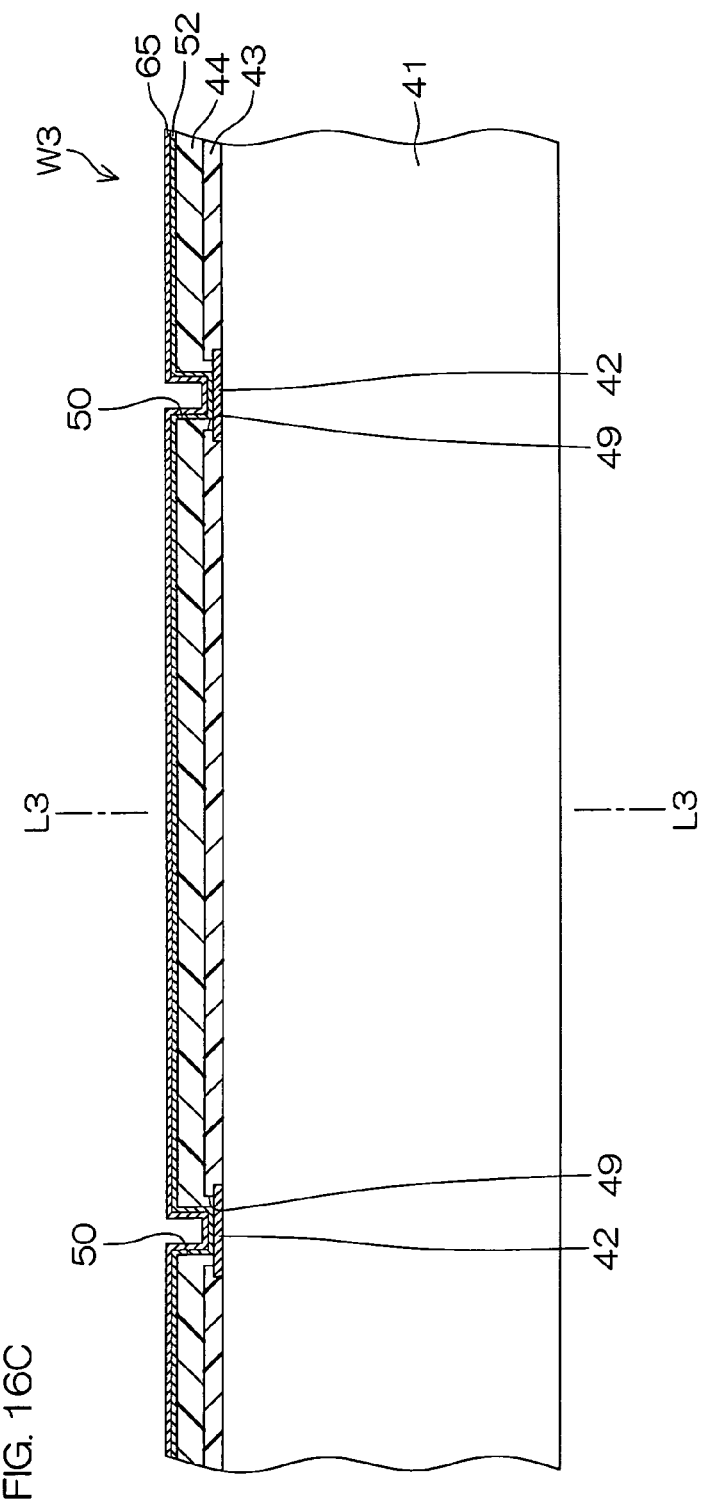
FIG. 16C is a diagram showing a step next to the step of FIG. 16B.

After the formation of the through-holes 50, as shown in FIG. 16C, a bump underlying layer 52 and a copper film 65 are formed in this order on the resulting wafer W3.

Figure 16D:
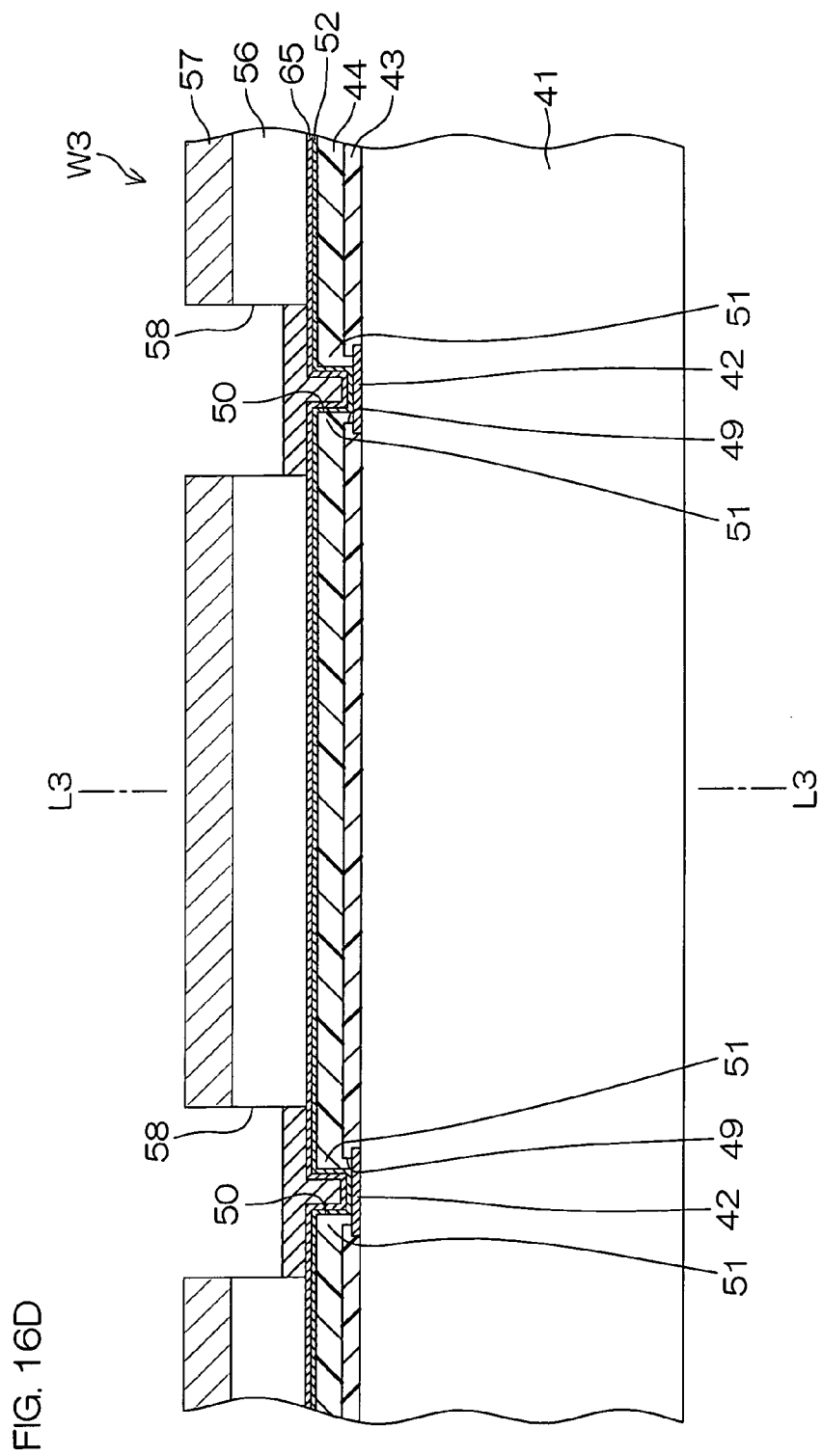
FIG. 16D is a diagram showing a step next to the step of FIG. 16C.

Then, as shown in FIG. 16D, a photoresist 56 and a metal layer 57 are formed on the copper film 65. More specifically, the photoresist 56 is formed on the copper film 65 as having openings 58 in regions to be formed with projections 54 of connection pads 45 by a known photolithography technique. After the formation of the photoresist 56, the metal layer 57 is formed from copper as a material for the connection pads 45 in the entire region on the resulting wafer W3 by a sputtering method or the like.

Thereafter, the photoresist 56 is removed, whereby an unnecessary portion (a portion except for the connection pads 45) of the metal layer 57 is lifted off together with the photoresist 56. Thus, the connection pads 45 are formed.

In turn, as shown in FIG. 16E, unnecessary portions (except for portions to be formed with outer peripheral copper films 64) of the copper film 65 and the bump underlying layer 52 are removed by etching. Thus, metal flanges each defined by a peripheral portion 61 of an outer peripheral copper film 64 surrounding the projection 54 of the connection pad 45 are formed.

Then, as shown in FIG. 16F, entire surfaces (each including a distal surface 54A and a side surface 54B) of the projections 54 of the connection pads 45 projecting on the stress relief layer 44 are formed with minute undulations, for example, by etching (e.g., dry etching) or the like. Thus, the distal surface 54A and the side surface 54B are roughened.

Figure 16G:
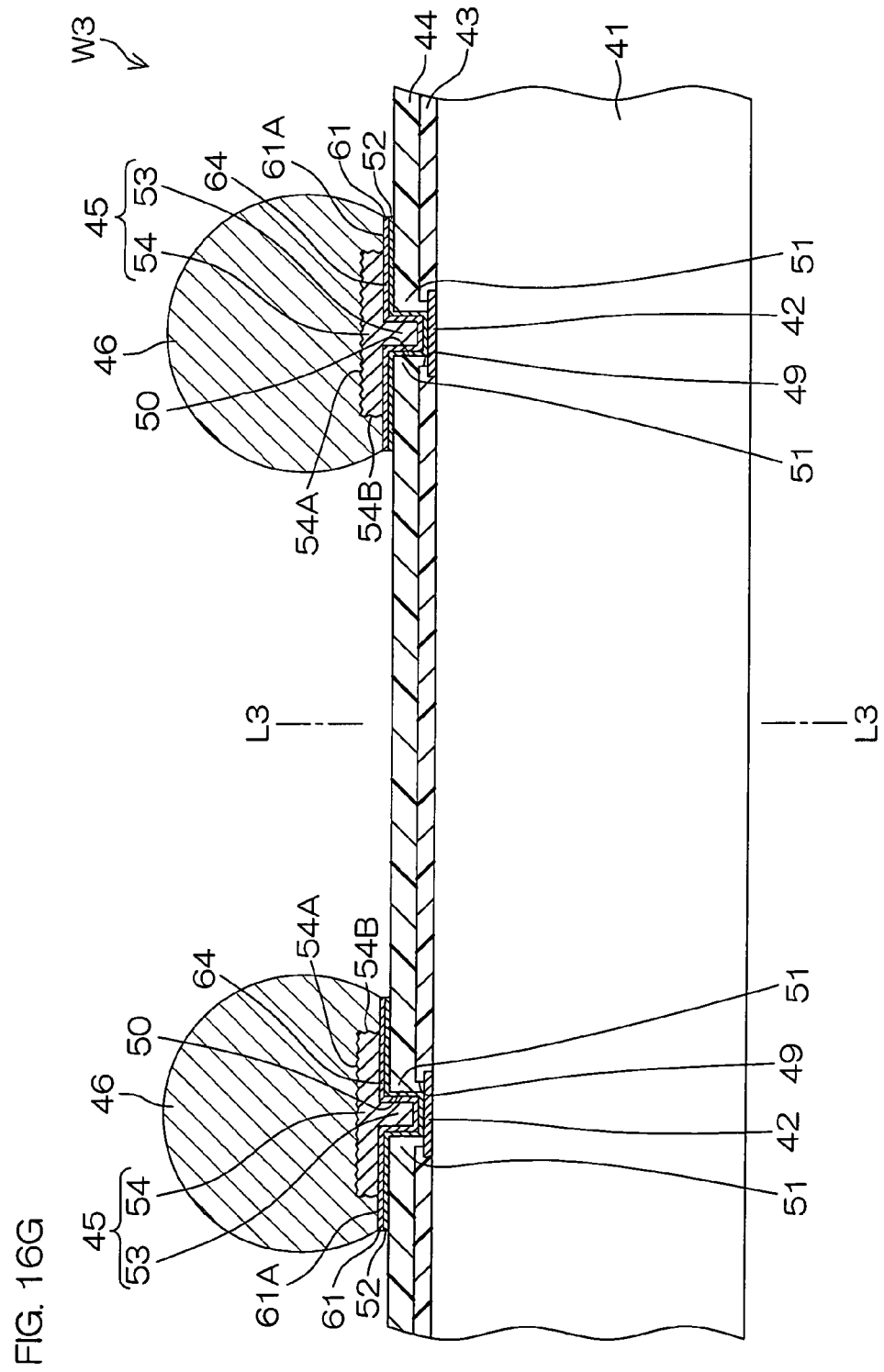
FIG. 16G is a diagram showing a step next to the step of FIG. 16F.

Subsequently, as shown in FIG. 16G, solder balls 46 are bonded to the respective connection pads 45 as each covering the entire rough surface (the distal surface 54A and the side surface 54B) of the projection 54 of the connection pad 45 and a surface 21A of the peripheral portion 61 of the outer peripheral copper film 64. Then, as shown in FIG. 16H, the resulting wafer W3 is cut (diced) along dicing lines L3 defined between the semiconductor chips 41 in the wafer W3. Thus, semiconductor devices are provided, which each have the construction shown in FIG. 15.

In the arrangement shown in FIG. 15, as described above, the solder balls 46 are bonded to the respective connection pads 45 as each covering the entire surface (the distal surface 54A and the side surface 54B) of the projection 54. Therefore, this arrangement provides the same effects as the arrangement shown in FIGS. 10 and 11.

In the second embodiment, the peripheral portion 61 of the outer peripheral copper film 64 made of copper is disposed on the stress relief layer 44 as surrounding the projection 54. Thus, the solder can easily wet and spread over the distal surface 54A of the projection 54 as well as the surface 21A of the peripheral portion 61 of the outer peripheral copper film 64. As a result, the bonding strength of the solder ball 46 is further improved.

While several embodiments of the present invention have thus been described, the invention may be embodied in other ways.

Figure 9:
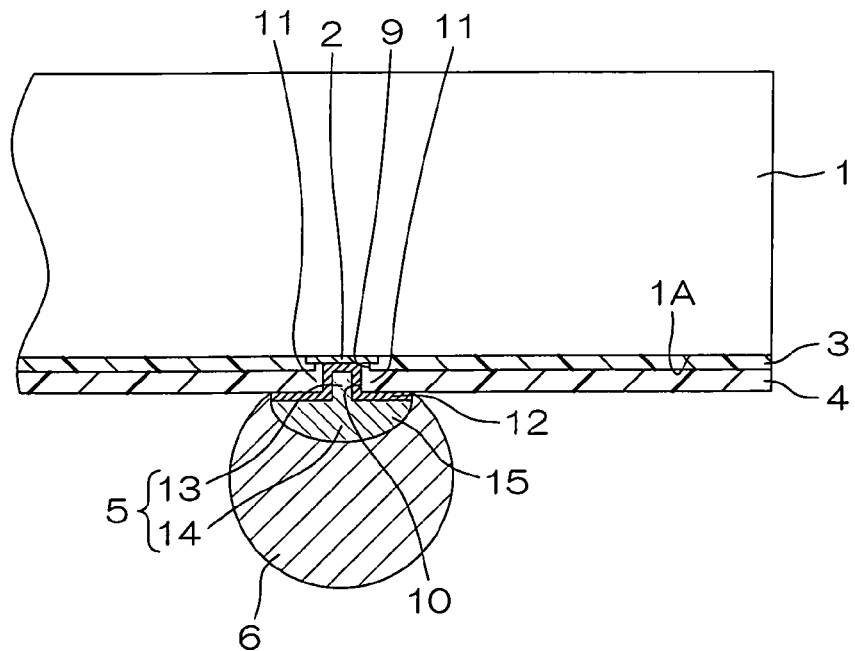
FIG. 9 is a schematic sectional view showing a modification of the semiconductor device of FIG. 1 in which a projection of the connection pad is modified.

In the first embodiment, for example, the projection 14 of the connection pad 5 is cylindrical, but the connection pad 5 may have an oval semispherical shape as shown in FIG. 9.

In the first and second embodiments, the electrode pads 2 are arranged in two rows in the rectangular frame-like area along the outer periphery of the semiconductor chip 1. As long as the electrode pads 2 are regularly arranged on the functional surface 1A of the semiconductor chip 1, the arrangement of the electrode pads 2 in the semiconductor chip 1 is not limited to the rectangular frame-like arrangement, but may be, for example, a matrix arrangement.

Figure 17:
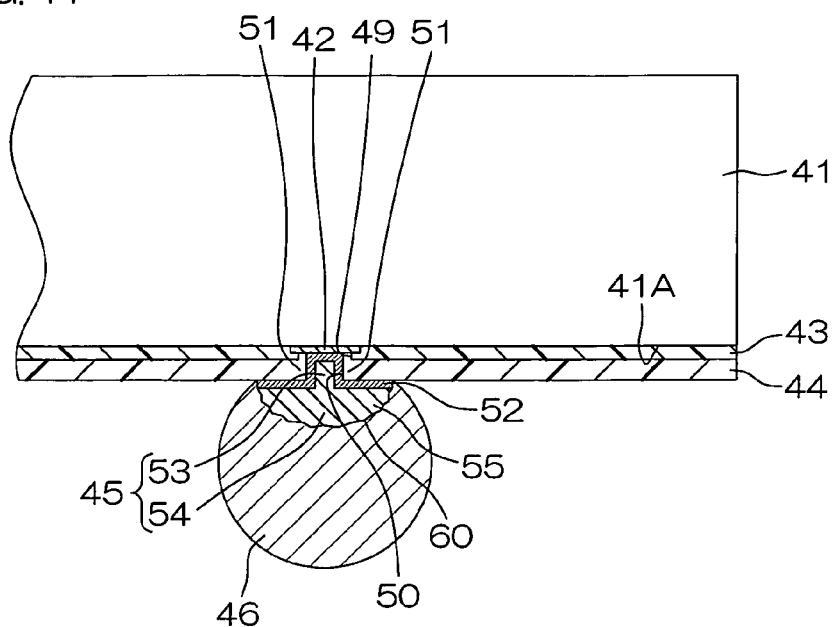
FIG. 17 is a schematic sectional view showing a modification of the semiconductor device of FIG. 10 in which a projection of the connection pad is modified.

In the third and fourth embodiments, for example, the projection 54 of the connection pad 45 is cylindrical, but the connection pad 45 may have an oval semispherical shape as shown in FIG. 17. In this case, a surface 60 of the oval semispherical connection pad 45 is preferably roughened with minute undulations.

Figure 18:
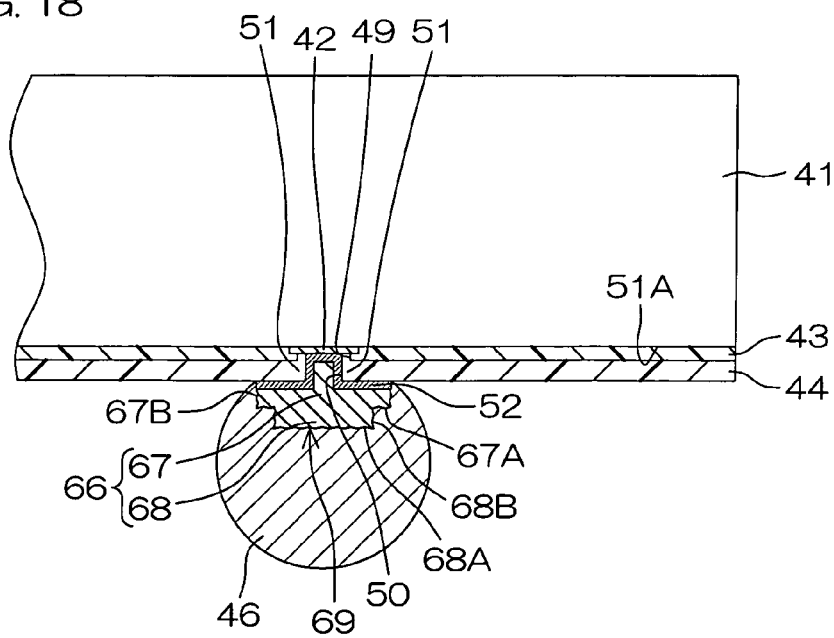
FIG. 18 is a schematic sectional view showing a modification of the semiconductor device of FIG. 10 in which the connection pad is modified.
Figure 19:
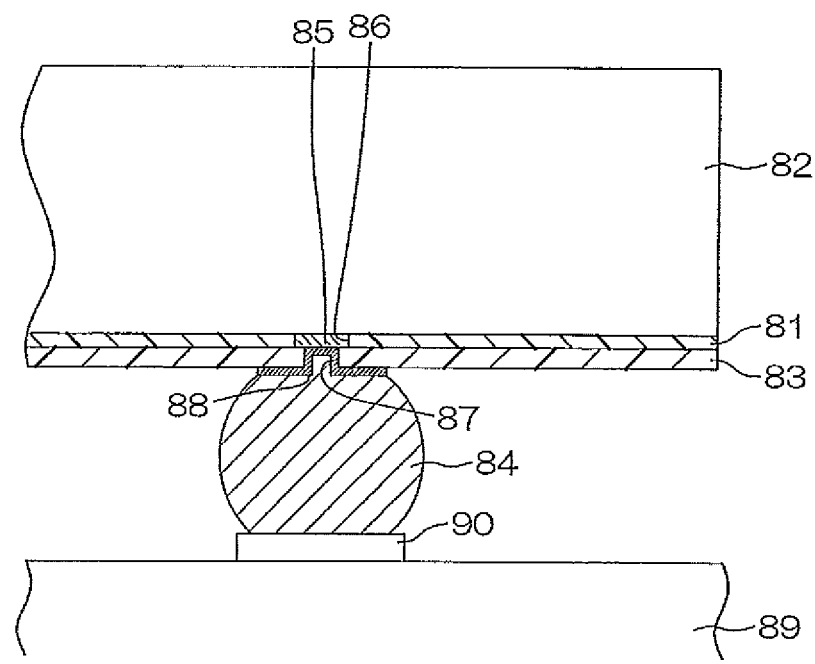
FIG. 19 is a schematic sectional view showing the construction of a prior art semiconductor device which is mounted on a mount board.

Further, as shown in FIG. 18, metal pads 69 each including a projection 66 having an upper projection portion 67 provided on the side of the stress relief layer 44 with respect to the stacking direction and a lower projection portion 68 provided below the upper projection portion 67 integrally with the upper projection portion 67, for example, may be provided instead of the connection pads 45. In this case, a lower surface 67A and a side surface 67B of the upper projection portion 67 and a distal surface 68A and a side surface 68B of the lower projection portion 68 are preferably roughened with minute undulations.

In the third and fourth embodiments, the connection pad 45 and the outer peripheral copper film 64 are separately formed, but may be formed integrally from the same material.

In the third and fourth embodiments, the generally spherical solder ball 46 is provided as the solder terminal bonded to the connection pad 45, but a thin planar solder terminal may be bonded to the connection pad 45 by using a reduced amount of the solder.

In the third and fourth embodiments, the electrode pads 42 are arranged in two rows in the rectangular frame-like area along the outer periphery of the semiconductor chip 41. As long as the electrode pads 42 are regularly arranged on the functional surface 41A of the semiconductor chip 41, the arrangement of the electrode pads 42 in the semiconductor chip 41 is not limited to the rectangular frame-like arrangement, but may be, for example, a matrix arrangement.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2006-348571 filed in the Japanese Patent Office on Dec. 25, 2006 and Japanese Patent Application No. 2006-348574 filed in the Japanese Patent Office on Dec. 25, 2006, the disclosure of which is incorporated herein by reference.

What is claimed is:

1. A semiconductor device, comprising:
   a semiconductor chip;
   an internal pad provided on a surface of the semiconductor chip for electrical connection;
   a surface protective film covering the surface of the semiconductor chip and having a pad opening from which the internal pad is exposed;
   a stress relief layer provided on the surface protective film and having an opening portion through which the internal pad exposed from the pad opening is exposed;
   a bump underlying layer that covers the internal pad, an interior surface of the opening portion of the stress relief layer and a surface of the stress relief layer around the opening portion;
   a connection pad made of copper, the connection pad including a copper anchor buried in the pad opening and the opening portion and connected to the internal pad via the bump underlying layer, and a copper projection provided integrally with the anchor and projecting on the stress relief layer, the projection having a width greater than an opening width of the opening portion and a width of the internal pad, the projection being opposed to the surface of the stress relief layer via the bump underlying layer, the projection having a distal surface that faces away from the stress relief layer, and which has a first portion disposed directly aligned with the anchor and a second portion over the stress relief layer, the first portion and the second portion collectively defining the entire distal surface of the projection as being flat and being at a common level, the distal surface and a side surface of the projection being rough; and
   a metal ball provided for external electrical connection and covering the projection of the connection pad.

2. The semiconductor device according to claim 1, wherein the projection of the connection pad is cylindrical.

3. The semiconductor device according to claim 1, wherein the distal surface and the side surface are in direct physical contact with the solder terminal.

4. The semiconductor device according to claim 3, wherein the solder terminal covers the entire distal surface and side surface.

* * * * *